United States Patent
Ahn

(10) Patent No.: US 9,799,551 B2
(45) Date of Patent: Oct. 24, 2017

(54) METHOD OF MANUFACTURING SEMICONDUCTOR DEVICE

(71) Applicant: Samsung Electronics Co., Ltd., Suwon-si (KR)

(72) Inventor: Jongseon Ahn, Yongin-si (KR)

(73) Assignee: SAMSUNG ELECTRONICS CO., LTD., Samsung-ro, Yeongtong-gu, Suwon-si Gyeonggi-do (KR)

( * ) Notice: Subject to any disclaimer, the term of this patent is extended or adjusted under 35 U.S.C. 154(b) by 0 days.

(21) Appl. No.: 15/016,286

(22) Filed: Feb. 5, 2016

(65) Prior Publication Data

US 2016/0351445 A1 Dec. 1, 2016

(30) Foreign Application Priority Data

May 27, 2015 (KR) .................... 10-2015-0074119

(51) Int. Cl.
*H01L 21/768* (2006.01)
*H01L 21/311* (2006.01)
*H01L 21/033* (2006.01)

(52) U.S. Cl.
CPC .... *H01L 21/76808* (2013.01); *H01L 21/0337* (2013.01); *H01L 21/31144* (2013.01); *H01L 21/76816* (2013.01)

(58) Field of Classification Search
CPC ............... H01L 21/76879; H01L 21/311
USPC ........................................... 438/666
See application file for complete search history.

(56) References Cited

U.S. PATENT DOCUMENTS

| | | | |
|---|---|---|---|
| 6,730,570 B2 | 5/2004 | Shin et al. | |
| 7,517,792 B2 | 4/2009 | Takayama et al. | |
| 7,935,625 B2 | 5/2011 | Kim et al. | |
| 2003/0155642 A1* | 8/2003 | Davis | H01L 22/32 257/700 |
| 2004/0232558 A1* | 11/2004 | Toda | H01L 21/76807 257/774 |
| 2005/0170642 A1* | 8/2005 | Hineman | H01L 21/76807 438/637 |
| 2006/0131754 A1* | 6/2006 | Ohtake | H01L 21/31116 257/760 |
| 2007/0281465 A1* | 12/2007 | Otsuka | H01L 21/76808 438/624 |
| 2013/0176073 A1 | 7/2013 | Bao et al. | |

FOREIGN PATENT DOCUMENTS

| | | |
|---|---|---|
| JP | H11-298010 A | 10/1999 |
| JP | 2010-098083 A | 4/2010 |
| KR | 10-2001-0077260 A | 8/2001 |
| KR | 10-2004-0001938 A | 1/2004 |

(Continued)

*Primary Examiner* — Moazzam Hossain
*Assistant Examiner* — Omar Mojaddedi
(74) *Attorney, Agent, or Firm* — Muir Patent Law, PLLC

(57) ABSTRACT

A method of manufacturing a semiconductor device may include forming an insulating layers on a substrate, forming a plurality of holes in an upper portion of the insulating layer, forming a mask layer having openings exposing at least a first set of the plurality of holes, etching a lower portion of the insulating layer exposed by one of the plurality of holes which is exposed by the mask layer to form a through hole in the insulating layer in combination with the one of the plurality of holes, and forming a conductive structure in the through hole.

11 Claims, 26 Drawing Sheets

(56) References Cited

FOREIGN PATENT DOCUMENTS

| KR | 10-0457038 B1 | 3/2004 |
| KR | 10-2009-0092926 A | 9/2009 |
| KR | 10-2010-0042925 A | 4/2010 |
| KR | 10-1124302 B1 | 3/2012 |

* cited by examiner

METHOD OF MANUFACTURING SEMICONDUCTOR DEVICE

CROSS-REFERENCE TO RELATED APPLICATIONS

This U.S. non-provisional patent application claims priority under 35 U.S.C. §119 to Korean Patent Application No. 10-2015-0074119, filed on May 27, 2015, the entire contents of which are hereby incorporated by reference.

BACKGROUND

This disclosure relates to methods of manufacturing a semiconductor device, and also relates to a method of manufacturing a semiconductor device in which a metal contact is self-aligned when interconnection lines are formed using a double patterning process.

As the degree of integration of semiconductor devices increases, spaces between devices become smaller and an area in which each device is to be formed gradually becomes smaller. Accordingly, sizes of contact areas are reduced and thereby an alignment margin in a photolithography process is reduced. As a result, contact failures may occur. A rapidly reducing design rule limits forming desired patterns using a photolithography process. Thus, in forming an interconnection line and a contact hole, it is beneficial to overcome a limitation of a photolithography process and secure a misalignment margin.

Currently, a contact plug connecting a substrate and/or impurity regions in the substrate is formed before an interconnection line is formed and then an interconnection line is formed to be connected to the contact plug.

SUMMARY

Embodiments of the inventive concept provide a method of manufacturing a semiconductor device. The method may include forming first and second insulating layers on a substrate, forming an interconnection contact hole in the second insulating layer, the interconnection contact hole exposing the first insulating layer, forming a mask layer having an opening exposing at least a part of the interconnection contact hole, etching the first insulating layer exposed by the opening to form a contact hole in the first insulating layer, removing the mask layer, and forming an interconnection structure in the contact hole and the interconnection contact hole.

The method may further comprise forming a hard mask pattern on the second insulating layer before forming the interconnection contact hole. The forming the hard mask pattern may comprise forming a hard mask layer on the second insulating layer, forming spacers on the hard mask layer and etching the hard mask layer exposed by the spacers.

Forming the spacers may comprise forming a sacrificial pattern on the hard mask layer, forming a spacer layer conformally covering a top surface of the hard mask layer and a surface of the sacrificial pattern on the hard mask layer, removing the spacer layer formed on the top surface of the hard mask layer and a top surface of the sacrificial pattern, and selectively removing the sacrificial pattern.

The hard mask patterns may be used as an etching mask to form the interconnection contact hole and the contact hole.

The hard mask patterns may be removed after the mask layer is removed to expose a top surface of the second insulating layer.

Forming the mask layer may comprise filling the remaining part of the interconnection contact hole.

The contact hole may be formed to vertically overlap the interconnection contact hole.

Forming the interconnection structure may comprise forming a conductive layer filling the contact hole and the interconnection contact hole on the second insulating layer, and performing a polishing process on the conductive layer until a top surface of the second insulating layer is exposed.

Embodiments of the inventive concept also provide a method of manufacturing a semiconductor device. The method may include forming a first insulating layer and a second insulating layer on a substrate to which an interlayer insulating layer including a lower contact is provided, forming an interconnection contact hole in the second insulating layer, the interconnection contact hole positioned over the lower contact to vertically overlap the lower contact, forming a mask layer having an opening on the first insulating layer, the opening vertically overlapping the lower contact, etching the first insulating layer exposed by the opening to form a contact hole exposing the lower contact, removing the mask layer, and forming an interconnection structure contacting the lower contact in the contact hole and the interconnection contact hole.

Forming the contact hole may comprise etching a part of the first insulating layer exposed by the opening and the interconnection contact hole at the same time.

The method may further comprise forming a hard mask pattern on the second insulating layer before forming the interconnection contact hole, wherein the hard mask pattern may be formed so that the second insulating layer on the lower contact is exposed.

The contact hole may be formed to vertically overlap the interconnection contact hole.

The forming the interconnection structure may comprise forming a conductive layer filling the contact hole and the interconnection contact hole on the second insulating layer, and performing a polishing process on the conductive layer until a top surface of the second insulating layer is exposed.

The interconnection structure may comprise an upper contact and a metal interconnection, the upper contact may be formed in the contact hole to directly contact the lower contact and the metal interconnection is formed in the interconnection contact hole.

The forming the interconnection structure may comprise forming an upper contact and a metal interconnection, the upper contact may be formed in the contact hole at the same time when the metal interconnection is formed in the interconnection contact hole to be self-aligned on the lower contact.

According to some embodiments of the disclose, a method of manufacturing a semiconductor device includes forming an insulating layer on a substrate, forming a plurality of holes in an upper portion of the insulating layer, forming a mask layer having openings exposing at least a set of the plurality of holes, etching a lower portion of the insulating layer exposed by one of the plurality of holes which is exposed by the mask layer to form a through hole in the insulating layer in combination with the one of the plurality of holes, and forming a conductive structure in the through hole.

The insulating layer may be formed of a plurality of layers and the upper portion includes at least one layer of the plurality of layers. The conductive structure may contact a contact structure formed below the through hole. The contact structure may be electrically coupled to a region comprising silicon or germanium. The region comprising silicon or germanium may be a source/drain region of a field effect transistor.

The forming the plurality of holes may comprise forming a hard mask layer on the insulating layer, forming a sacrificial pattern on the hard mask layer, forming a spacer layer conformally covering the sacrificial pattern and the hard mask layer, removing a portion of the spacer layer to form spacers exposing the upper surface of the sacrificial pattern and a portion of the hard mask layer, removing the sacrificial pattern, removing a portion of the hard mask layer using the spacers as an etch mask to form a mask pattern, and removing an upper portion of the insulating layer to form the plurality holes using the mask pattern as an etch mask.

BRIEF DESCRIPTION OF THE FIGURES

Example embodiments of the inventive concepts will be more clearly understood from the following detailed description taken in conjunction with the accompanying drawings. FIGS. 1A through 13B represent non-limiting, example embodiments as described herein.

FIGS. 1A through 13A are top plan views illustrating a method of manufacturing a semiconductor device in accordance with an embodiment of the inventive concept.

FIGS. 1B through 13B are exemplary cross sectional views taken along the lines I-I' and II-II' of FIGS. 1A through 13A.

DETAILED DESCRIPTION

Figure 1A:
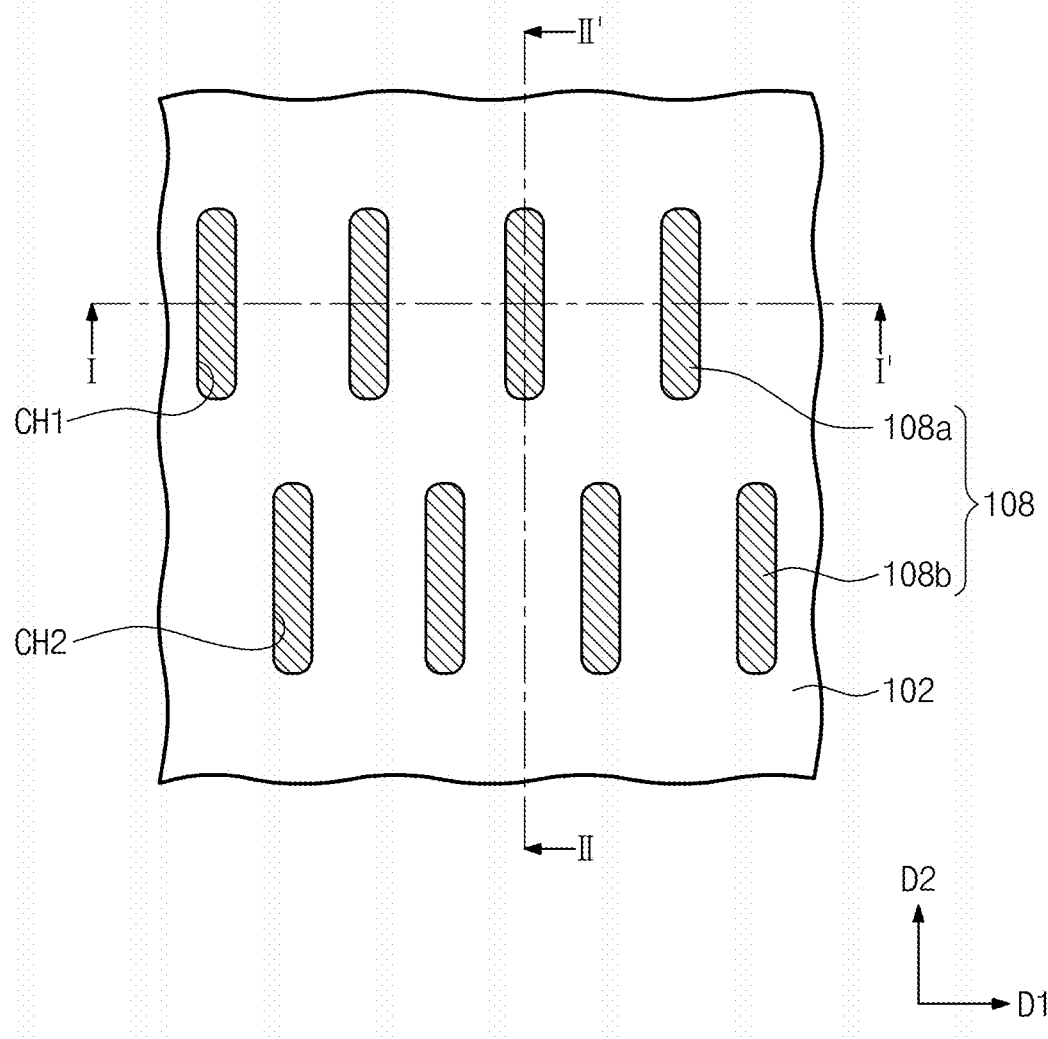

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention. In the drawings, the size and relative sizes of layers and regions may be exaggerated for clarity. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to direct contact (i.e., touching) unless the context indicates otherwise.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIGS. 1A through 13A are top plan views illustrating a method of manufacturing a semiconductor device in accordance with an embodiment of the inventive concept. FIGS. 1B through 13B are cross sectional views taken along the lines I-I' and II-II' of FIGS. 1A through 13A.

As used herein, a semiconductor device may refer to devices formed using the method described herein in FIGS. 1A-13A and 1B to 13B, and may thus refer, for example, to a set of transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

The methods described herein may be used to form, for example, one or more chips, packages, or modules including one or more integrated circuits including, for example, memory cell arrays or peripheral circuits. The methods may also be used to form other types of integrated circuits.

Figure 1B:
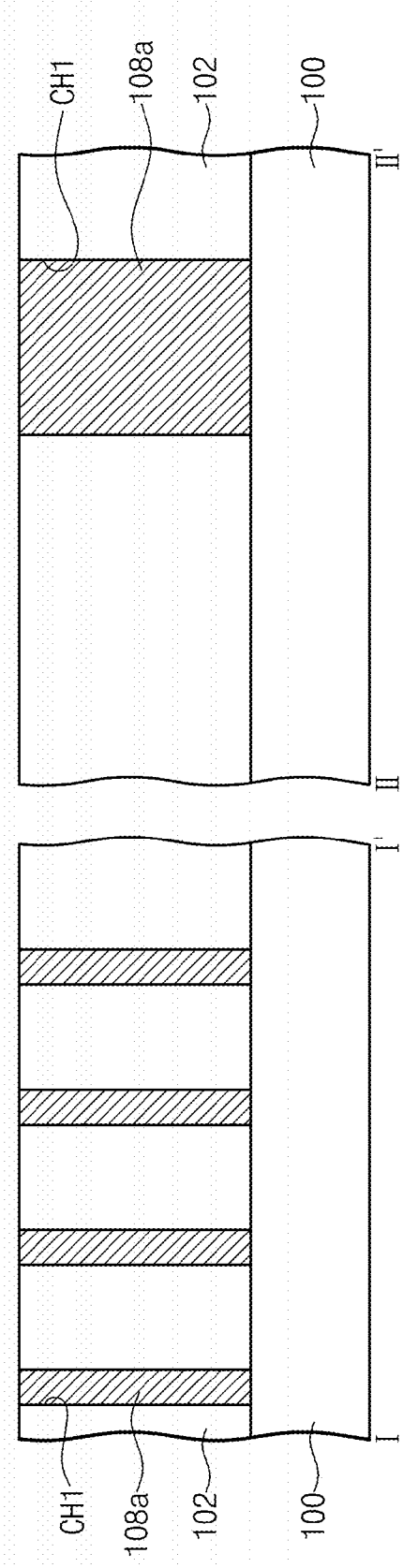

Referring to FIGS. 1A and 1B, an interlayer insulating layer 102 may be formed on a substrate 100. First lower contacts 108 may be formed in the interlayer insulating layer 102.

The substrate 100 may be, for example, a silicon substrate, a silicon germanium substrate, or a germanium substrate. Although not illustrated in the drawings, impurity regions (not illustrated) may be provided in the substrate 100. The interlayer insulating layer 102 may be, for example, a silicon oxide layer, a silicon nitride layer or a silicon oxynitride layer. The lower contacts 108 may be formed by forming first contact holes CH1 and second contact holes CH2 exposing a top surface of the substrate 100 in the interlayer insulating layer 102 and by filling the first contact holes CH1 and the second contact holes CH2 with a conductive material (e.g., tungsten, copper, aluminum). For example, the lower contact 108 may be electrically coupled to a source/drain region of a field effect transistor. For example, the lower contact 108 may contact a source/drain region of a field effect transistor.

Referring to FIG. 1A, the lower contacts 108 may be arranged along a first direction D1 and a second direction D2 crossing the first direction D1. For example, the first direction D1 may be perpendicular to the second direction D2. The lower contacts 108 may include a first lower contact 108a and a second lower contact 108b. A plurality of first lower contacts 108a and second lower contacts 108b may be formed. The first lower contacts 108a may be formed in the first contact holes CH1 and the second lower contacts 108b may be formed in the second contact holes CH2. The first lower contacts 108a may be disposed in a line along the first direction D1 and the second lower contacts 108b may be disposed in a line along the first direction D1. In certain embodiments, the first lower contacts 108a and the second lower contacts 108b may be disposed in a staggered manner. For example, the first lower contacts 108a and the second lower contacts 108b may be disposed in a diagonal, offset manner with respect to one another and with respect to the first and second directions D1 and D2. For example, the second lower contacts 108b adjacent to the respective first lower contacts 108a may be spaced apart from the first lower contacts 108a along the first direction D1.

In another example, although not illustrated in the drawing, the first lower contacts 108a and the second lower contacts 108b may be disposed in a line along the second direction D2.

Figure 2A:
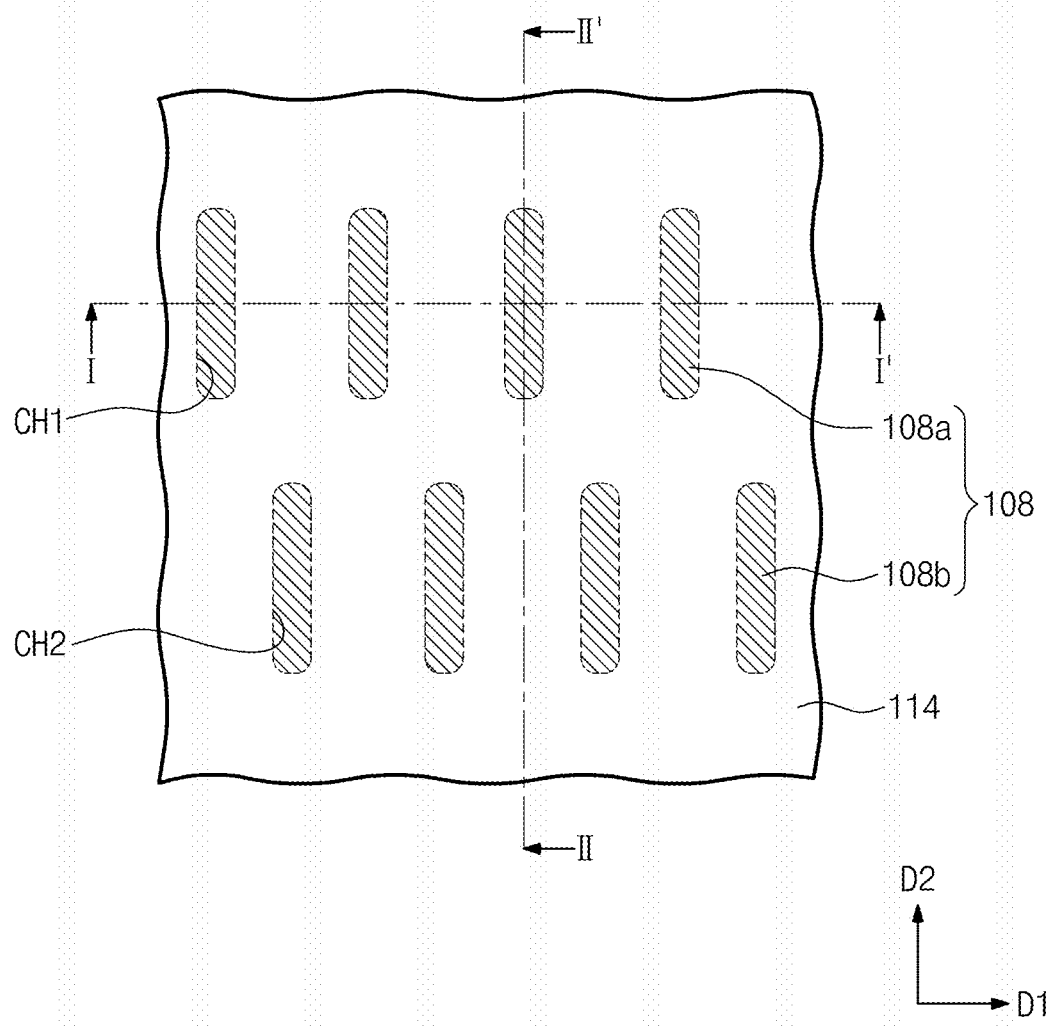
Figure 2B:
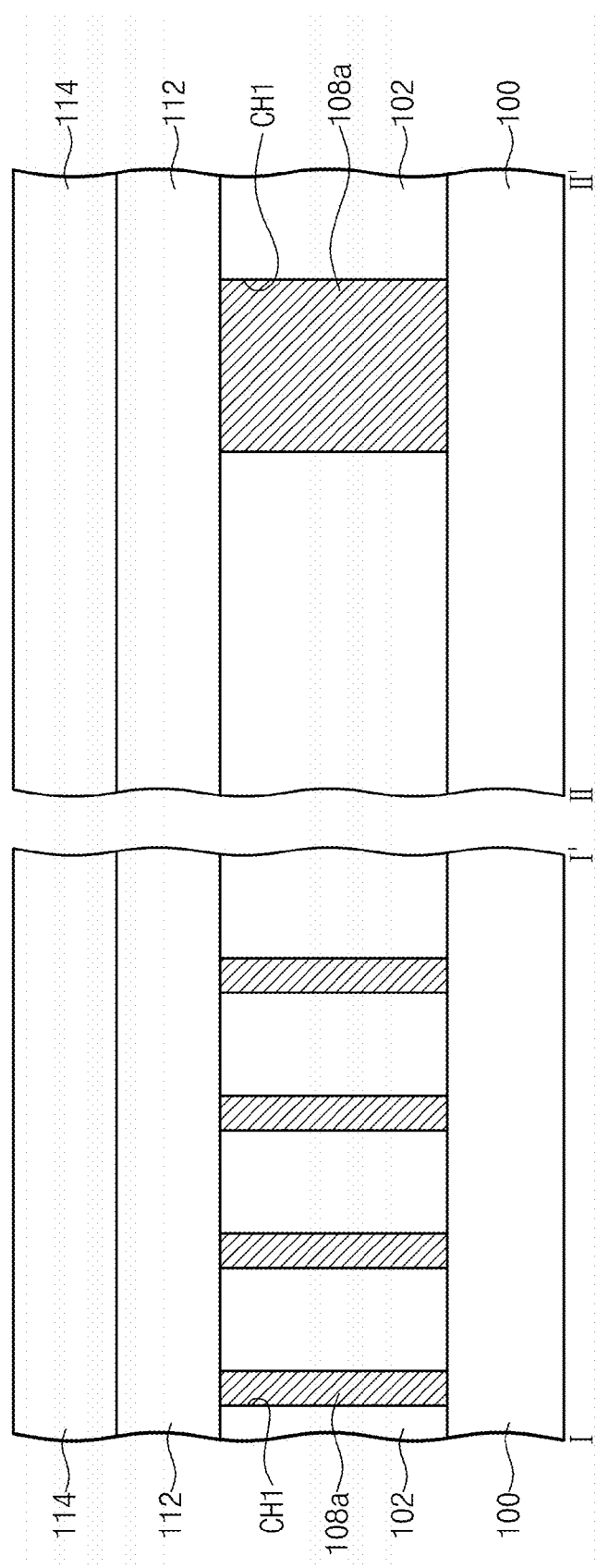

Referring to FIGS. 2A and 2B, a first insulating layer 112 and a second insulating layer 114 may be sequentially formed on the interlayer insulating layer 102. The first insulating layer 112 may cover top surfaces of the lower contacts 108. The first and second insulating layers 112 and 114 may be, for example, silicon oxide layers. Although not illustrated in the drawing, an etch stop layer (not illustrated) may be provided between the first insulating layer 112 and the second insulating layer 114. In certain embodiments, the first insulating layer 112 and the second insulating layer 114 may be merged into one insulating layer. For example, the first and second insulating layers 112 and 114 may be formed of one continuous insulating layer and may be formed of the same material. For example, the first insulating layer 112 may be a lower portion of an insulating layer, and the second insulating layer 114 may be an upper portion of the insulating layer. In certain embodiments, the insulating layer may be formed of more than two different insulating layers.

Figure 3A:
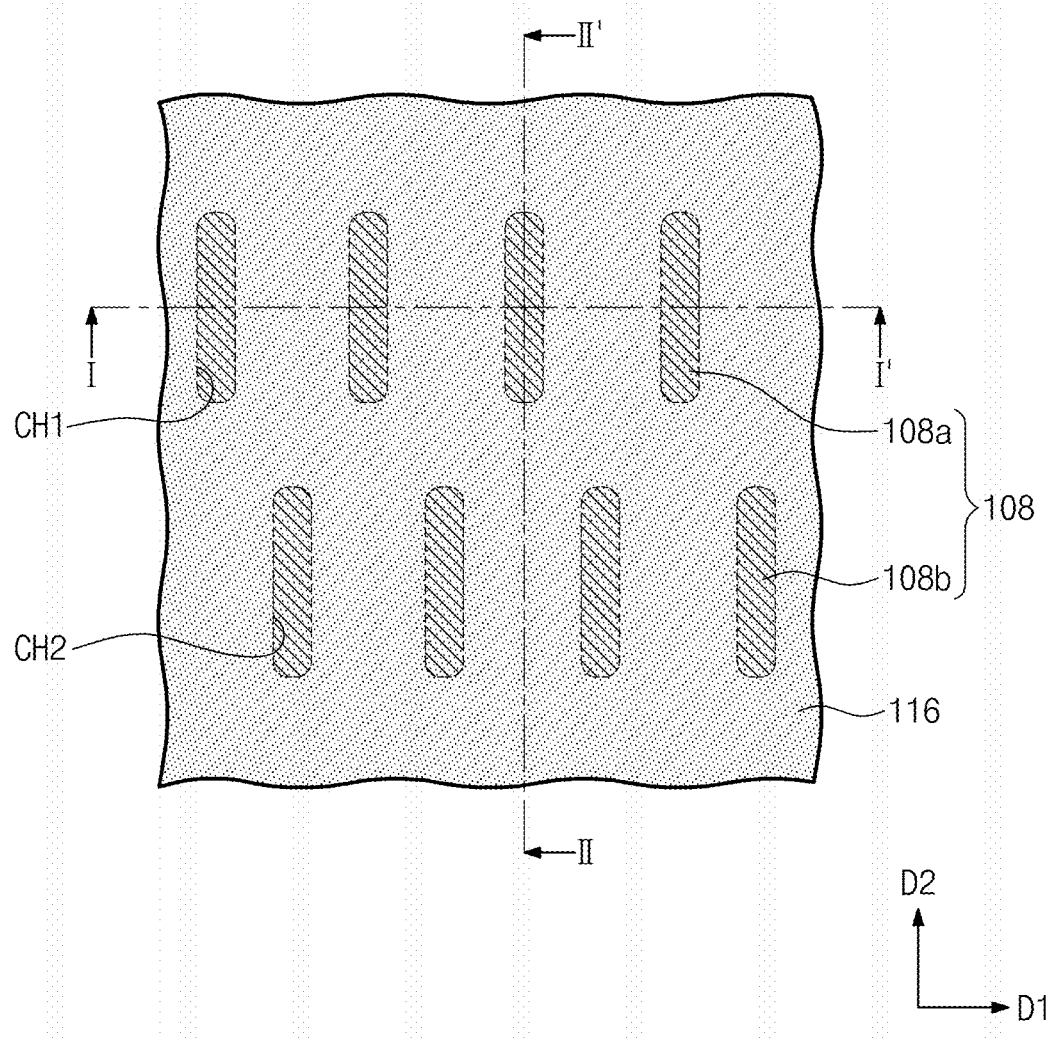
Figure 3B:
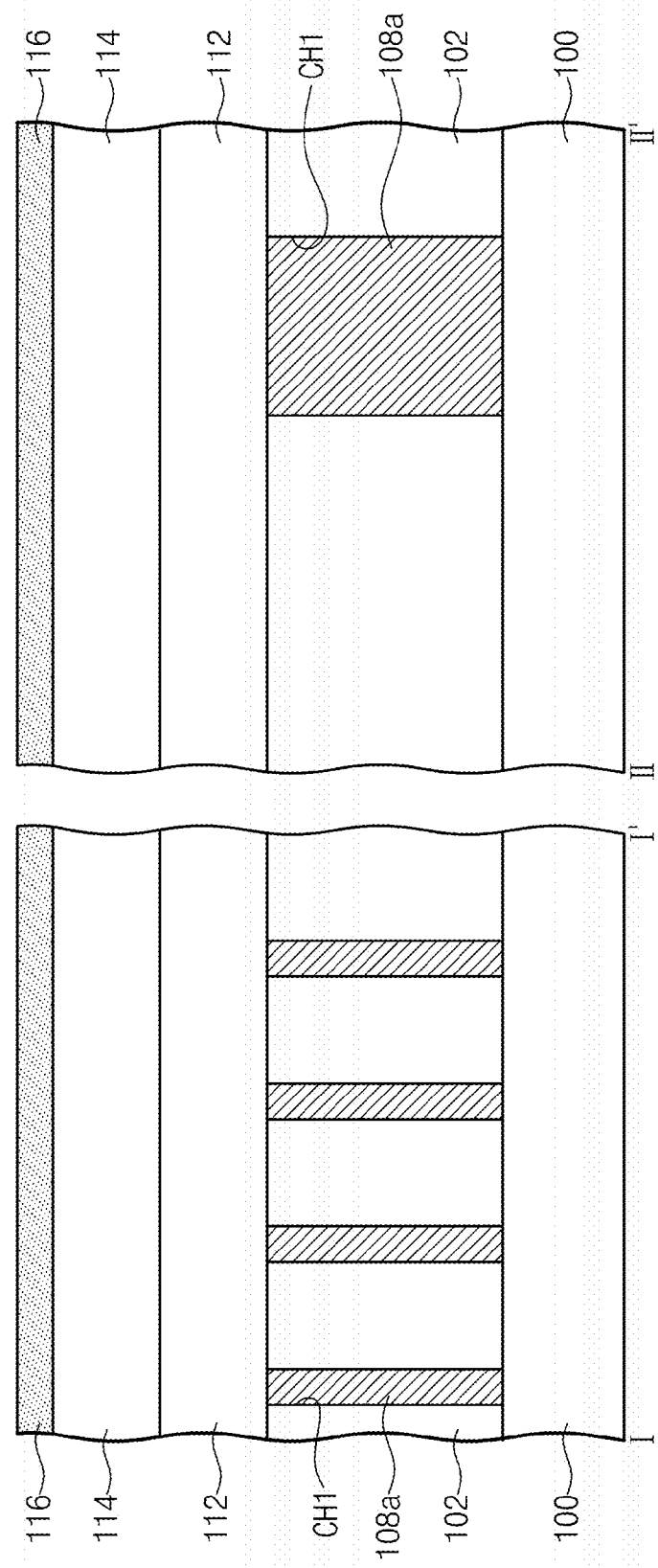

Referring to FIGS. 3A and 3B, a hard mask layer 116 may be formed on the second insulating layer 114. The hard mask layer 116 may include a material having an etching selectivity with respect to the first and second insulating layers 112 and 114. The hard mask layer 116 may be, for example, at least one of a poly silicon layer, a silicon nitride layer and a silicon oxynitride layer.

Figure 4A:
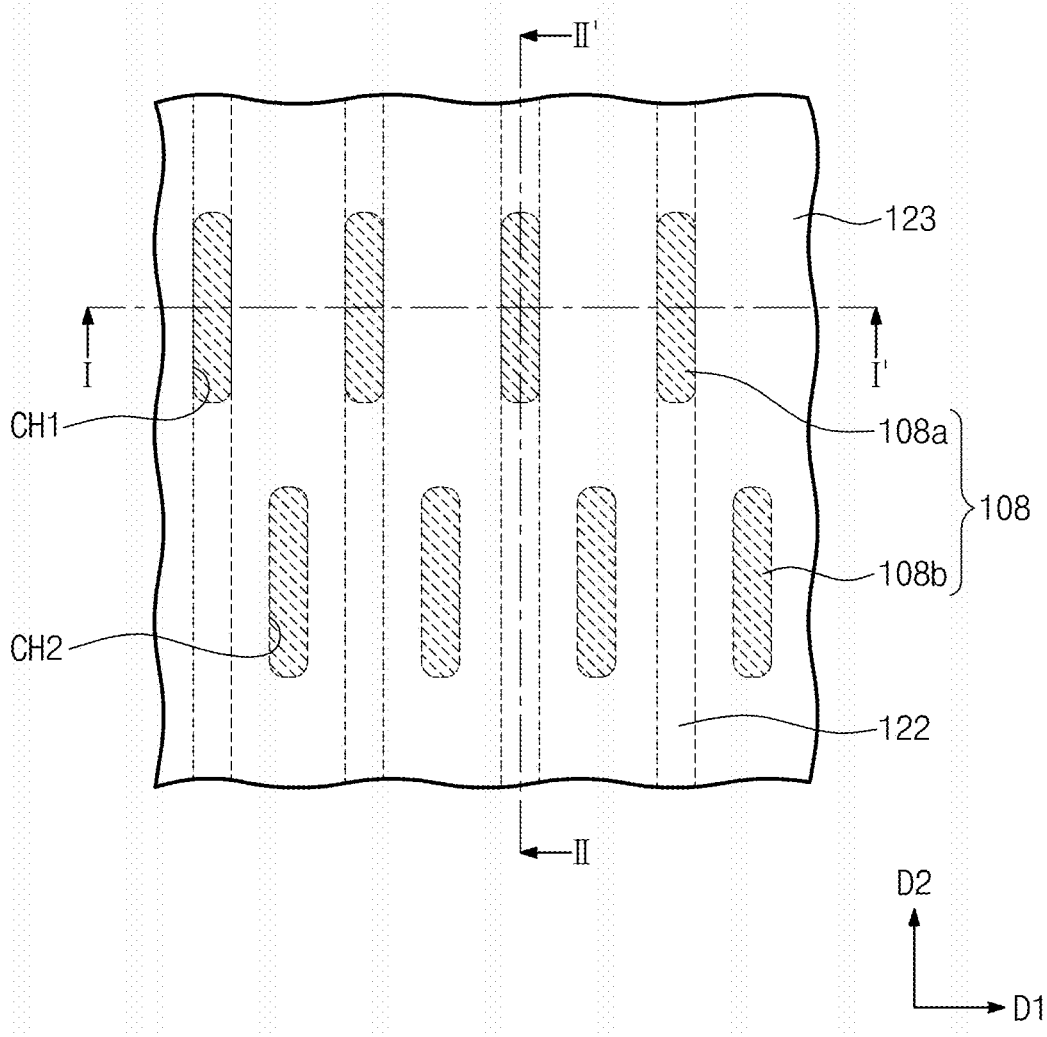
Figure 4B:
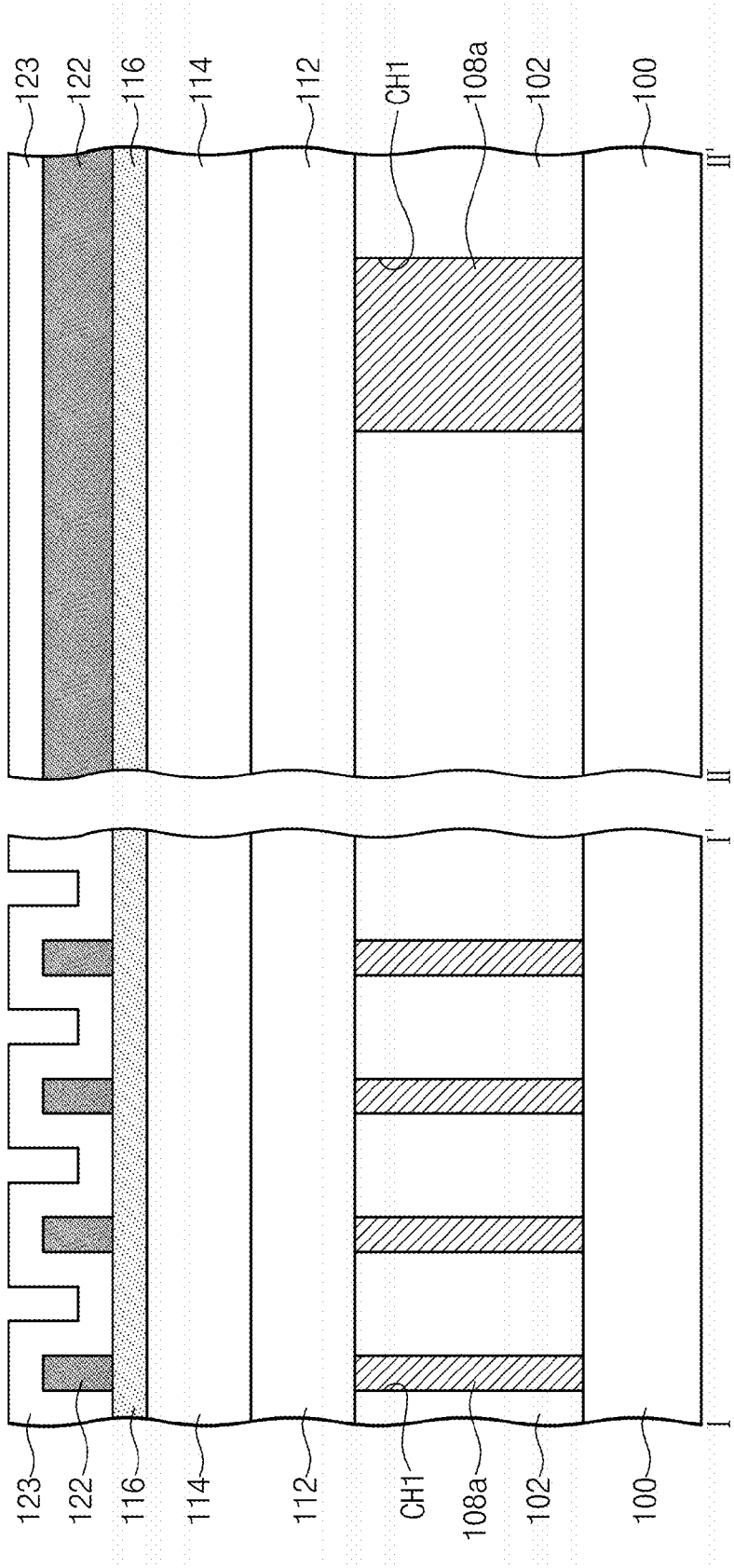

Referring to FIGS. 4A and 4B, sacrificial patterns 122 and a spacer layer 123 may be formed on the hard mask layer 116. The sacrificial patterns 122 may be arranged along the first direction D1. Each of the sacrificial patterns 122 may extend in the second direction D2. The sacrificial patterns 122 may be disposed on the first lower contacts 108a respectively.

The sacrificial patterns 122 may include a material having an etching selectivity with respect to the hard mask layer 116. For example, the sacrificial patterns 122 may include a spin-on-mask layer.

The spacer layer 123 may be formed to conformally cover top surfaces and sidewalls of the sacrificial patterns 122 and a top surface of the hard mask layer 116. The spacer layer 123 may include a material having an etching selectivity with respect to the hard mask layer 116 and the sacrificial patterns 122. For example, the spacer layer 123 may include silicon oxide.

Figure 5A:
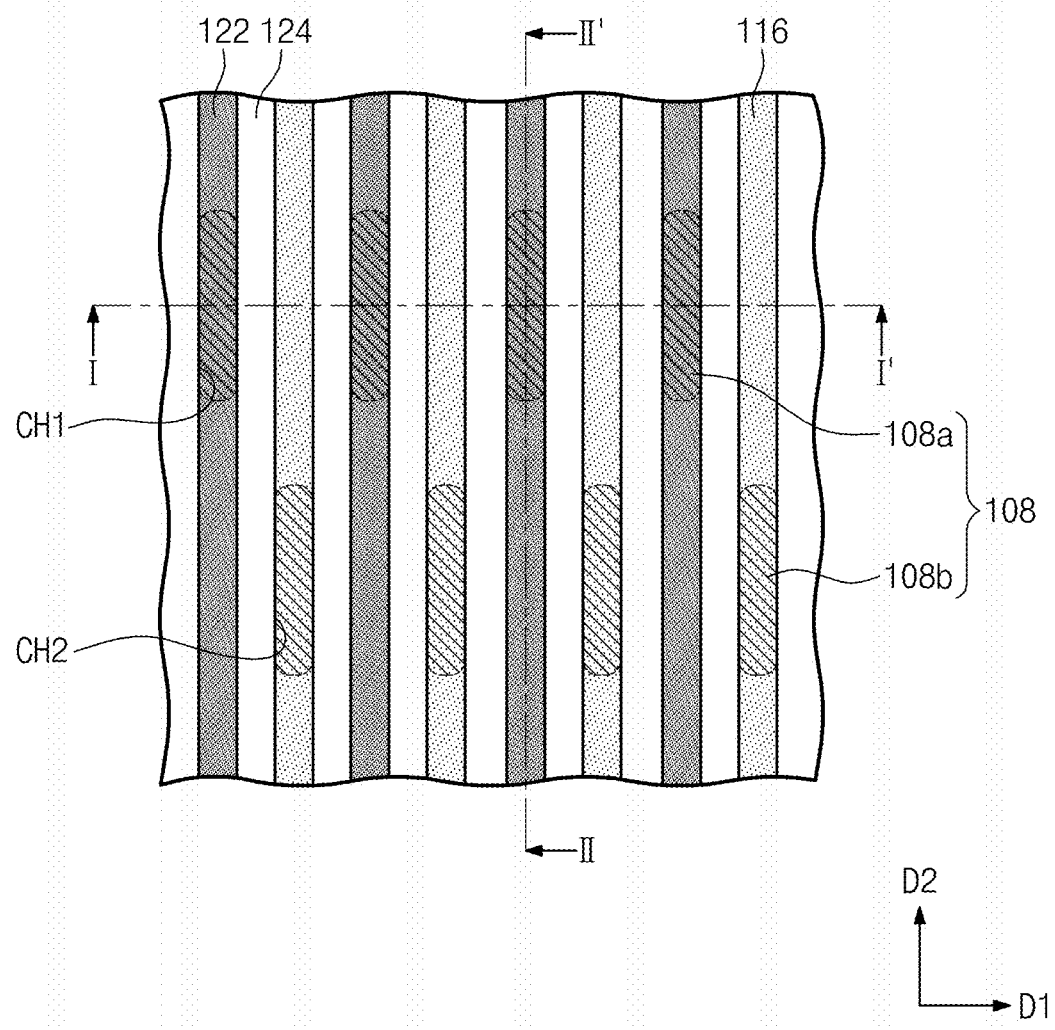
Figure 5B:
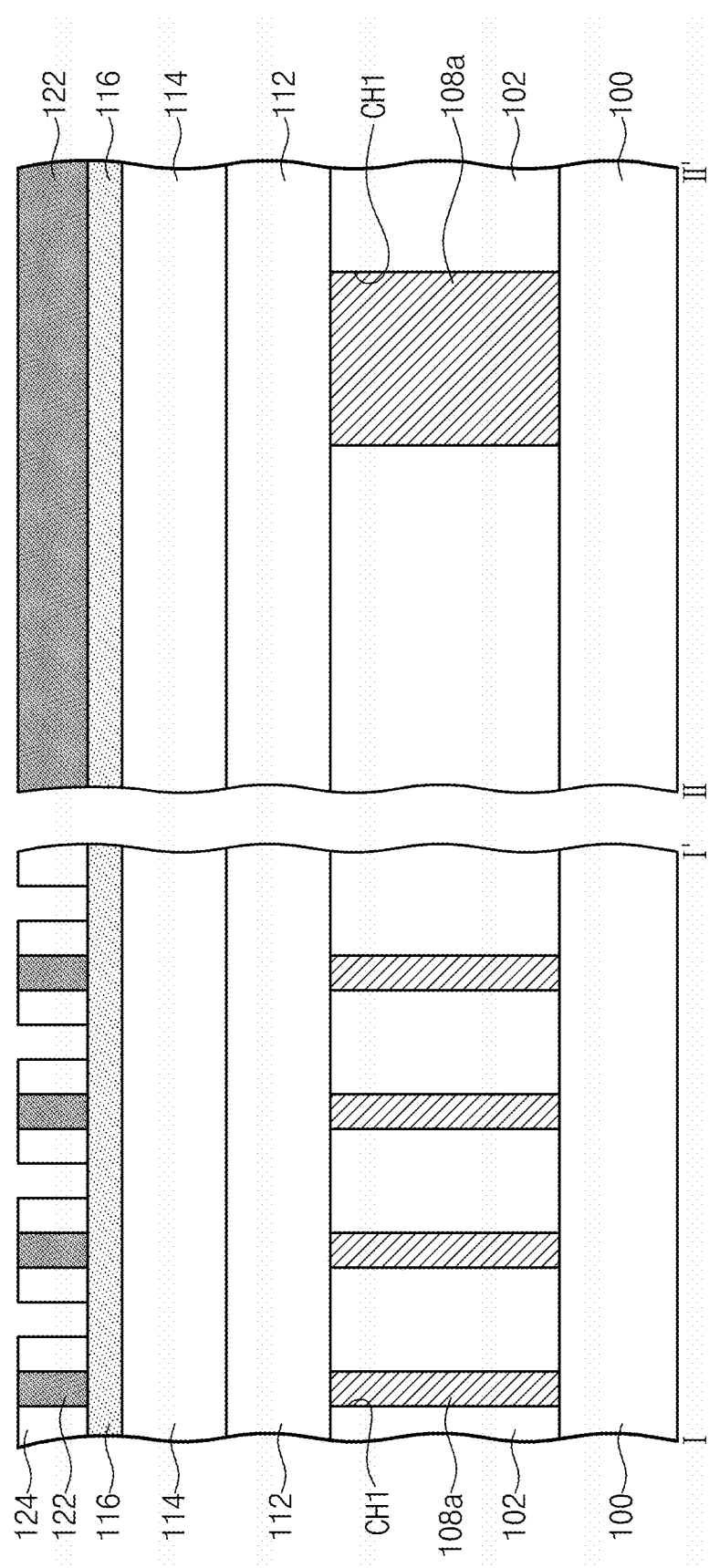

Referring to FIGS. 5A and 5B, spacers 124 may be formed on sidewalls of the sacrificial patterns 122. For example, the spacer layer 123 covering the top surfaces of the sacrificial patterns 122 and the top surface of the hard mask layer 116 may be removed through an etch back process to form the spacers 124. The spacers 124 may be arranged along the first direction D1. Each of the spacers 124 may be formed in a line form extending in the second direction D2. A part of the hard mask layer 116 may be exposed by the spacers 124 and the sacrificial patterns 122.

A part of the hard mask layer 116 exposed by the spacers 124 and the sacrificial patterns 122 may coincide with a part of the hard mask layer 116 on the second lower contacts 108b. For example, the spacers 124 and the sacrificial patterns 112 may not be provided on the second lower contacts 108b.

Figure 6A:
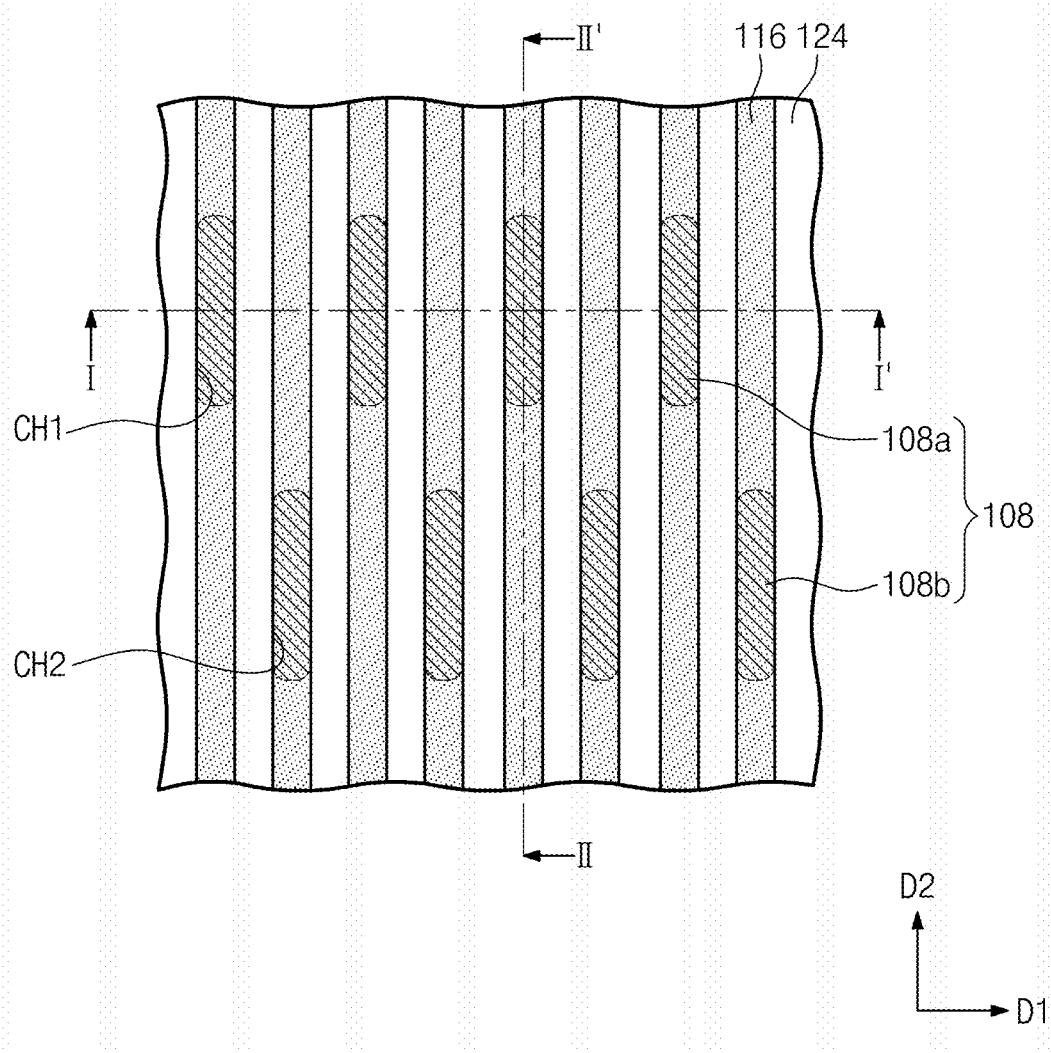
Figure 6B:
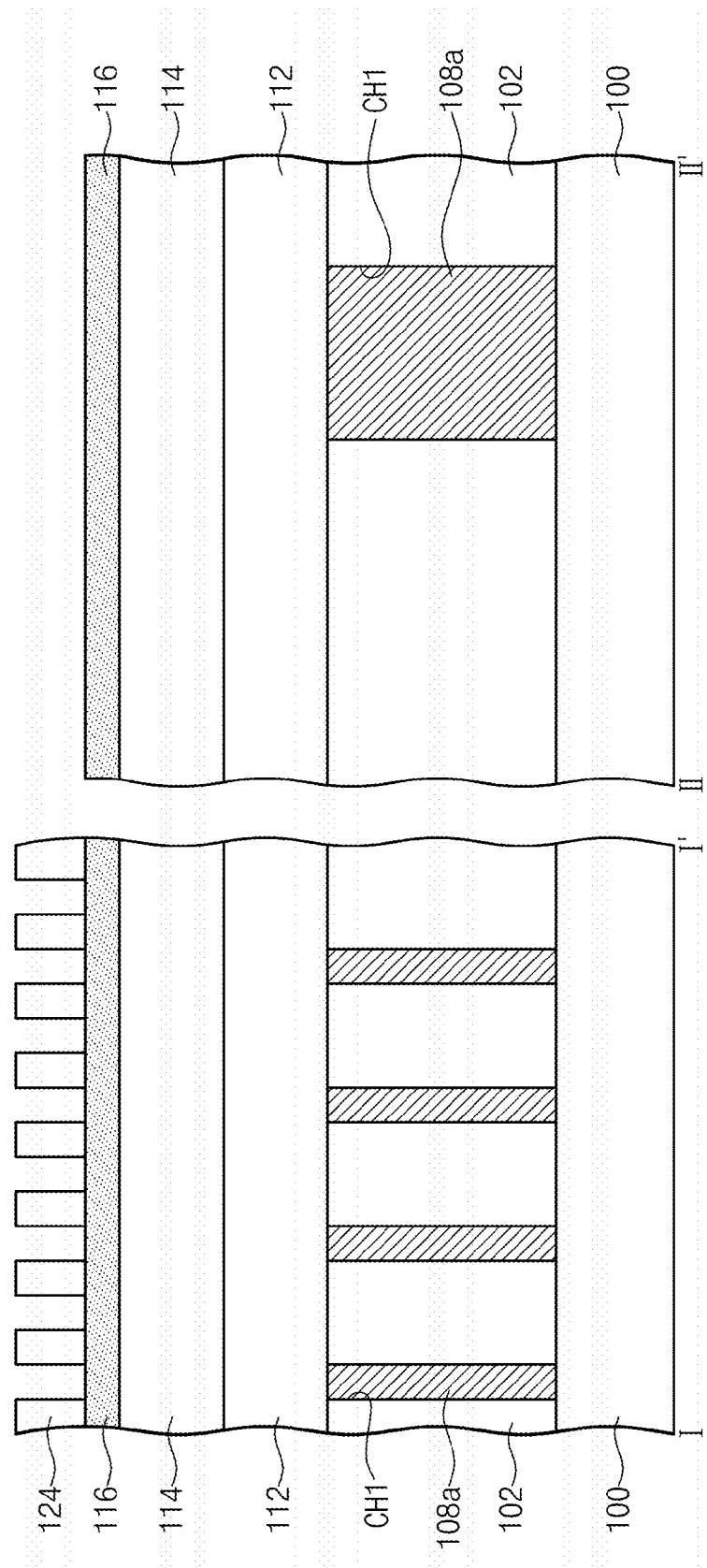

Referring to FIGS. 6A and 6B, the sacrificial patterns 122 may be selectively removed. As a result, only the spacers 124 may remain on the hard mask layer 116. Parts of the hard mask layer 116 exposed by the spacers 124 may coincide with parts of the hard mask layer 116 on the first and second lower contacts 108a and 108b, respectively. For example the sacrificial patterns 122 may be removed using an ashing process or an organic strip process.

Figure 7A:
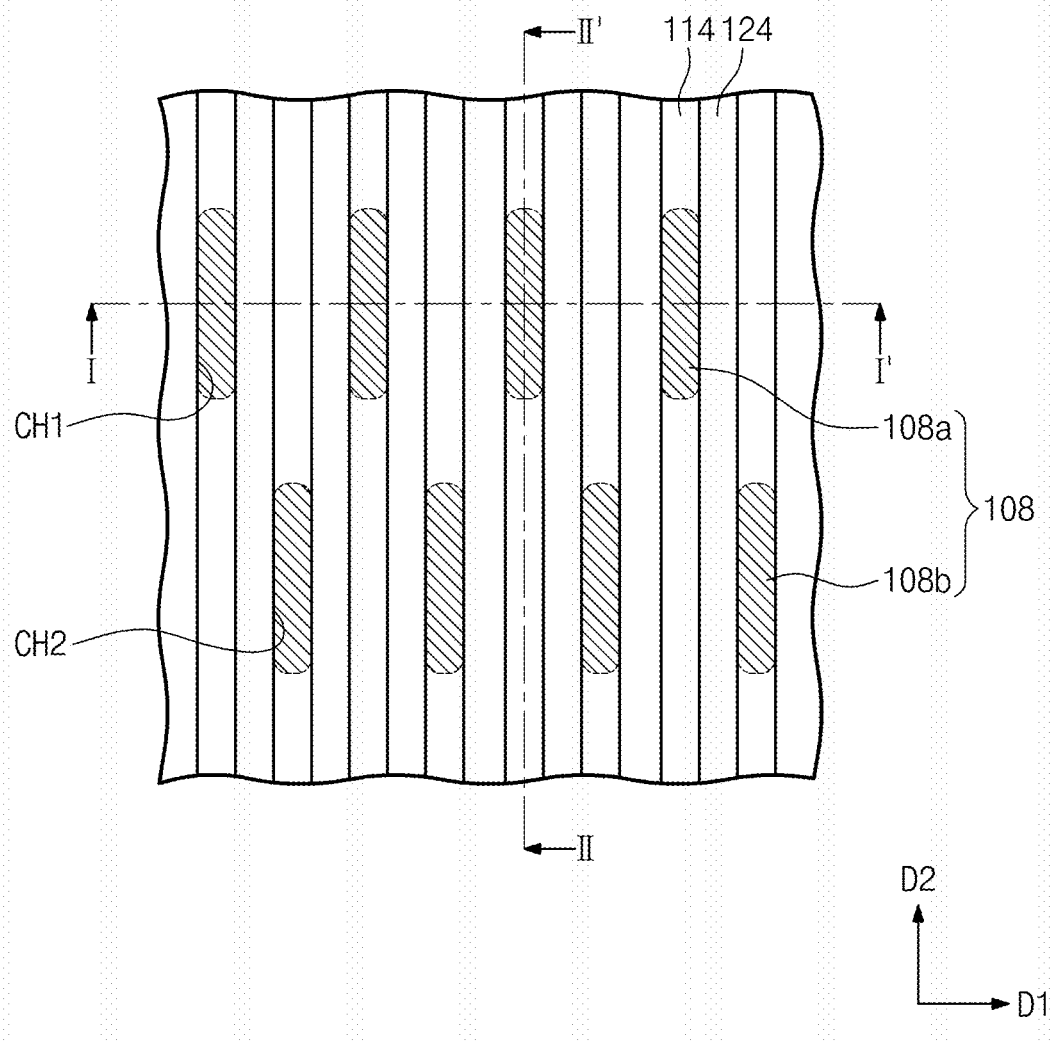
Figure 7B:
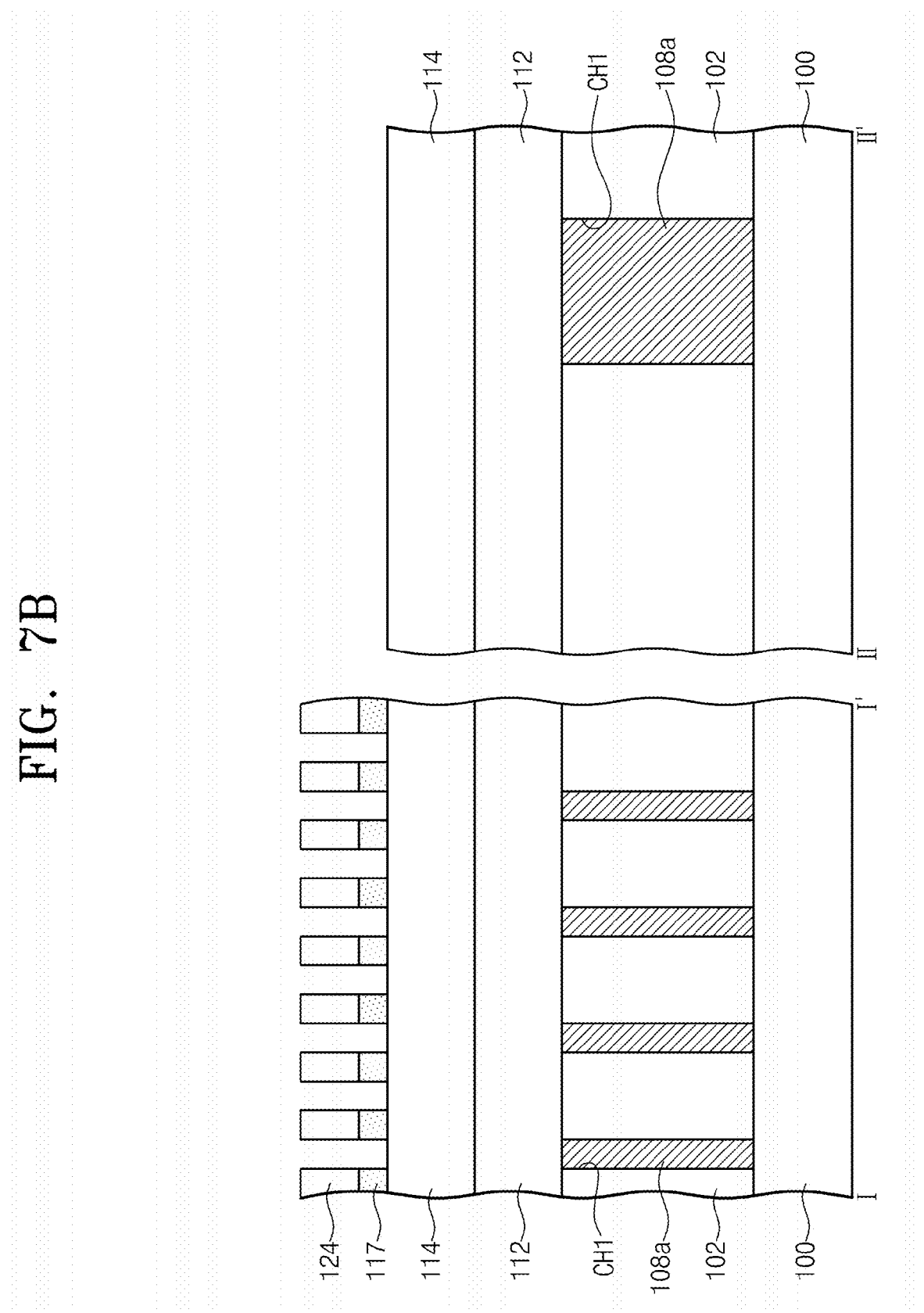

Referring to FIGS. 7A and 7B, the hard mask layer 116 may be etched using the spacers 124 as an etch mask. Accordingly, mask patterns 117 may be formed on the second insulating layer 114. The mask patterns 117 may be arranged in the first direction D1. Each of the mask patterns 117 may extend in the second direction D2. The mask patterns 117 may expose a part of the second insulating layer 114. The mask patterns 117 may be used as an etch mask for forming a metal interconnection and an upper contact in a subsequent process.

Figure 8A:
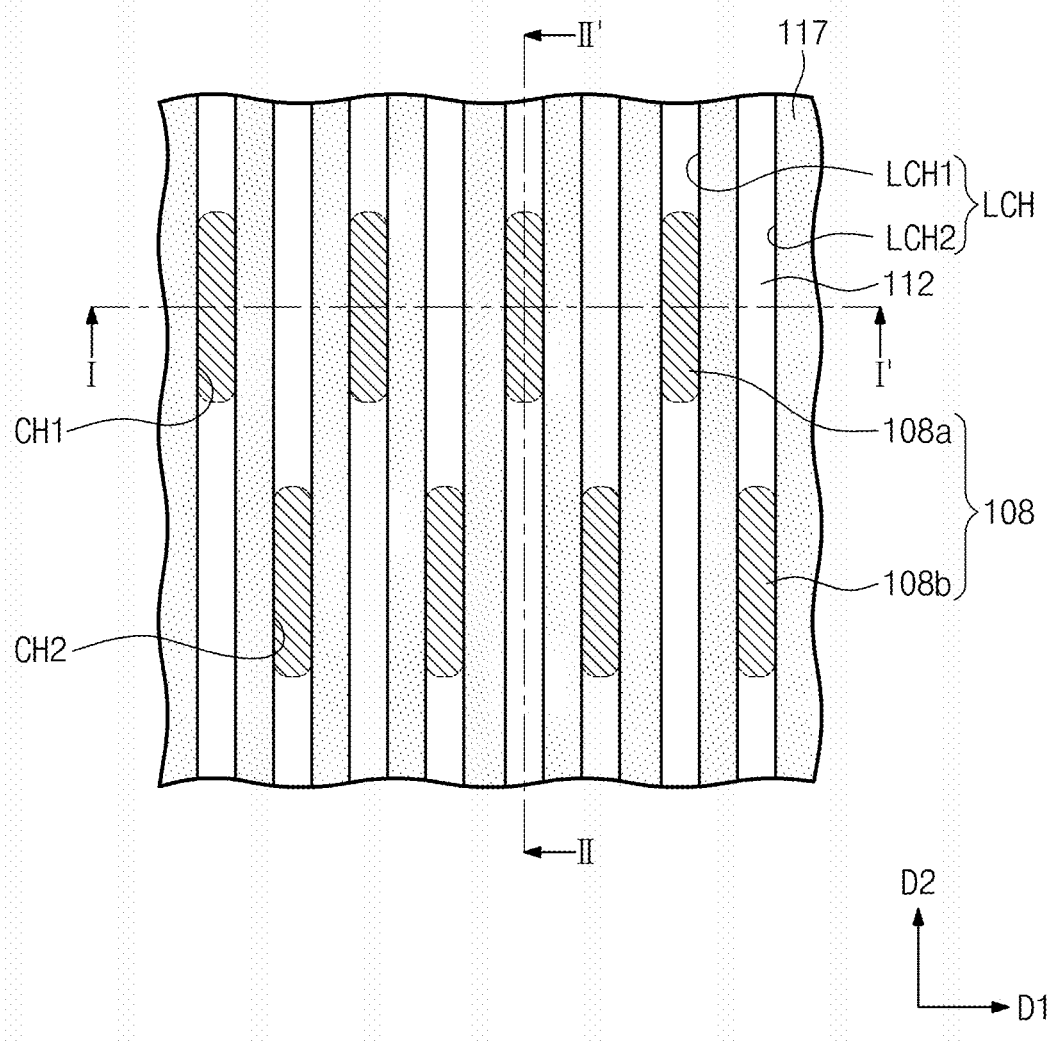
Figure 8B:
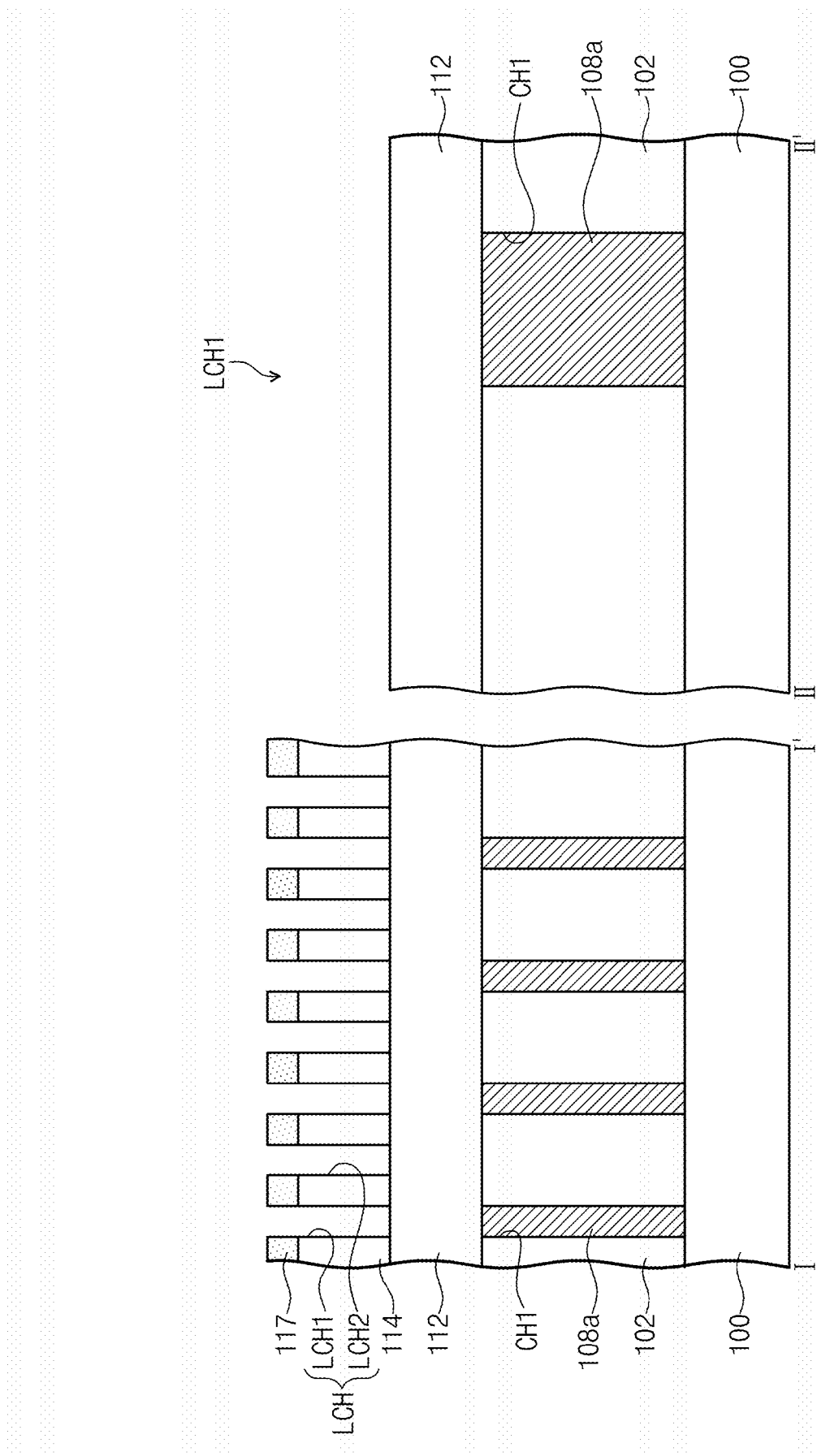

Referring to FIGS. 8A and 8B, after the mask patterns 117 are formed, the spacers 124 may be selectively removed. The spacers 124 may be removed through a wet or dry etching process. In the case of removing the spacers 124 using a wet etching process, a HF solution or a BOE solution may be used.

The second insulating layer 114 exposed by the mask patterns 117 may be etched to form an interconnection contact hole LCH. A plurality of interconnection contact holes LCH may be formed. The interconnection contact holes LCH may be arranged in the first direction D1. Each of the interconnection contact holes LCH may extend in the second direction D2. The interconnection contact holes LCH may include first interconnection contact holes LCH1 and second interconnection contact holes LCH2. The first and second interconnection contact holes LCH1 and LCH2 may be alternately arranged along the first direction D1. In a top plan view, the first interconnection contact holes LCH1 may be aligned with the first lower contacts 108a, respectively, and the second interconnection contact holes LCH2 may be aligned with the second lower contacts 108b, respectively. In certain embodiments where the first and second insulating layers 112 and 114 are merged into one insulating layer, the interconnection contact hole LCH is formed in an upper portion of the merged insulating layer.

Conductive interconnections, such as metal interconnections may be formed in the first and second interconnection contact holes LCH1 and LCH2 in later processes. The metal interconnections may be electrically connected to the respective first and second lower contacts 108a and 108b. For example, metal interconnections formed in the first interconnection contact holes LCH1 may be electrically connected to the first lower contacts 108a and metal interconnections formed in the second interconnection contact holes LCH2 may be electrically connected to the second lower contacts 108b.

Figure 9A:
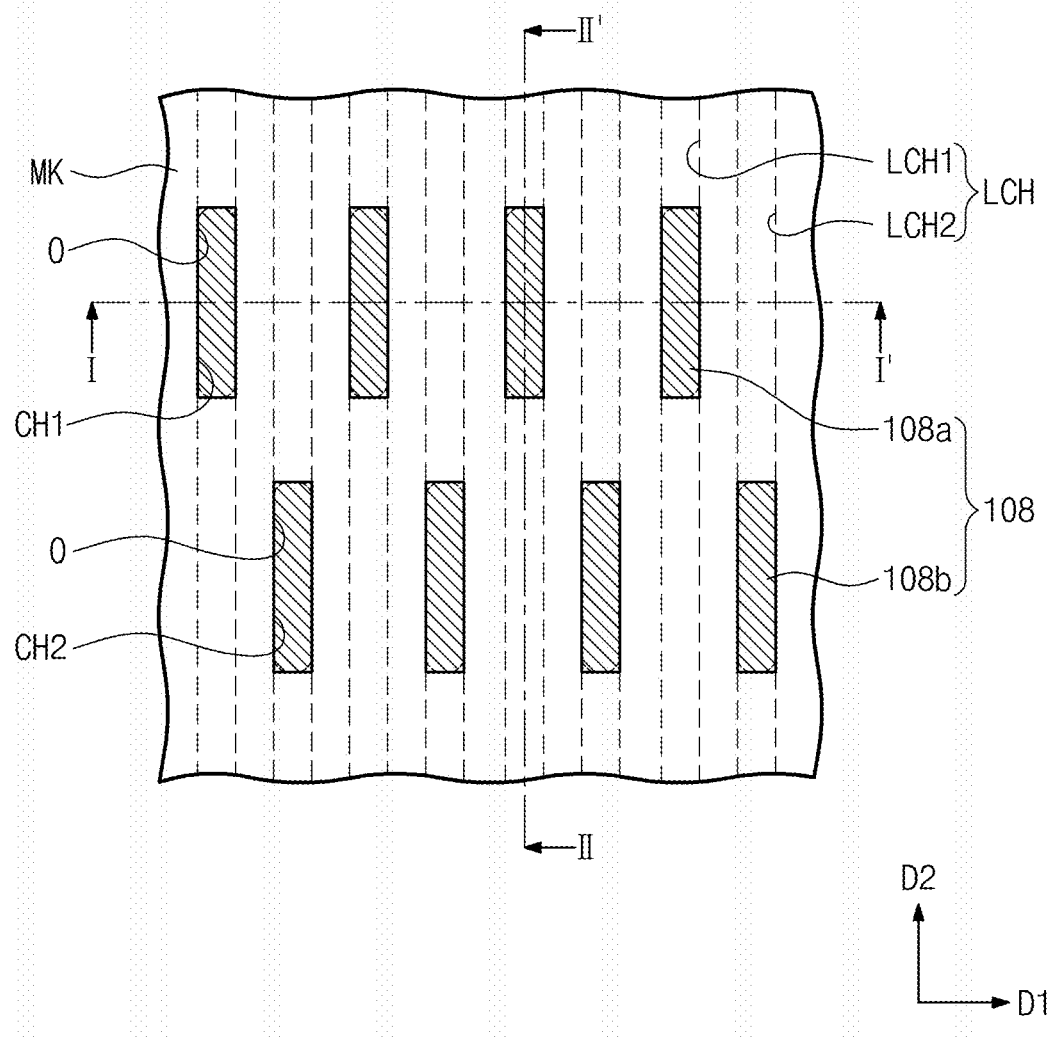
Figure 9B:
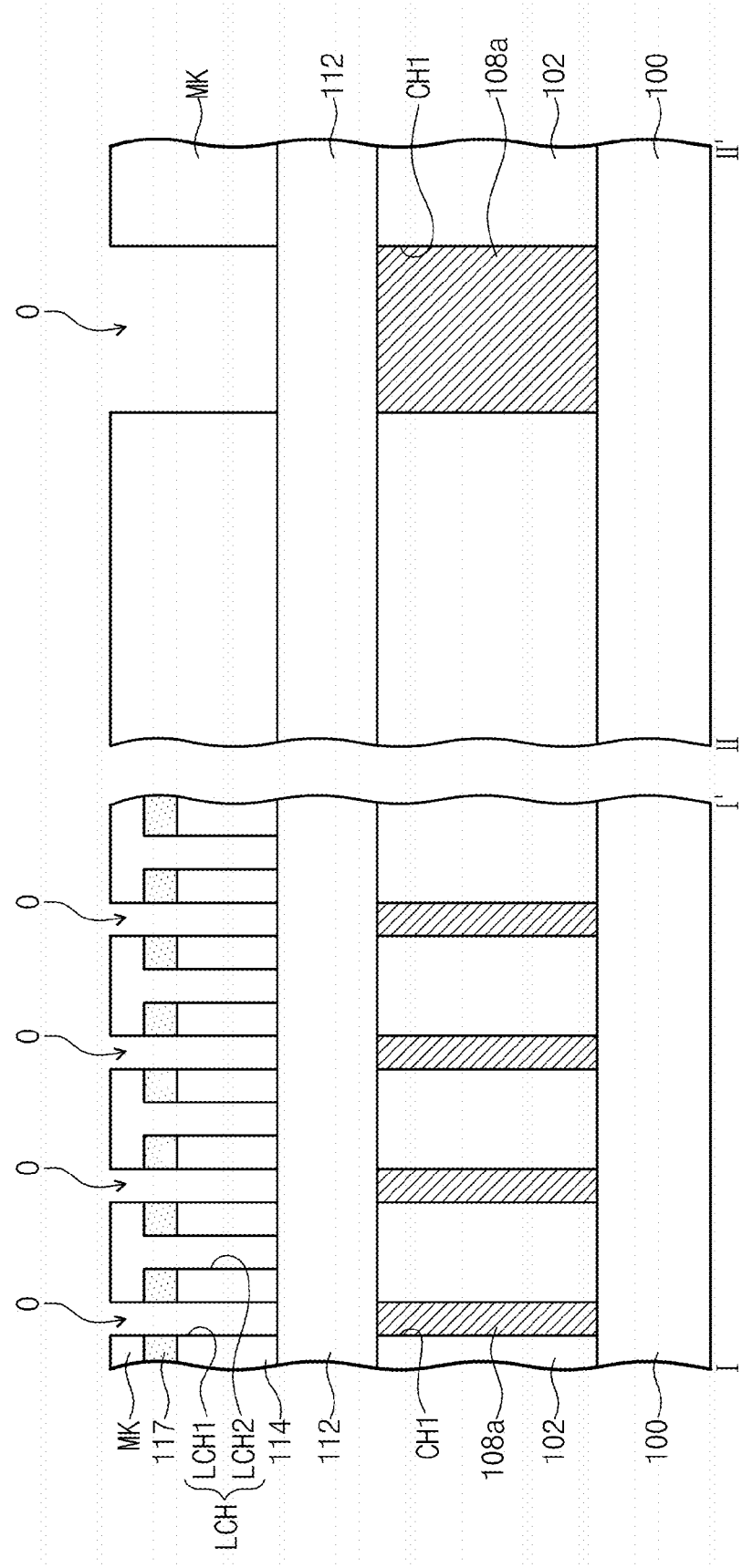

Referring to FIGS. 9A and 9B, a mask layer MK covering the mask patterns 117 may be formed on the first insulating layer 112. A part of the interconnection contact holes LCH may be filled by the mask layer MK. For example, the mask layer MK may fill a part of the interconnection contact holes LCH formed on the first insulating layer 112 covering an upper surface of interlayer insulating layer 102.

The mask layer MK may include openings O. The openings O may be disposed on the first and second lower contacts 108a and 108b. For example, the openings O may vertically overlap the first and second lower contacts 108a and 108b. Accordingly, a part of the first insulating layer 112 covering the first and second lower contacts 108a and 108b may be exposed by the openings O. Parts of the first insulating layer 112 on the first lower contacts 108a may be exposed by the openings O, respectively, through parts of the first interconnection contacts LCH1. Parts of the first insulating layer 112 on the second lower contacts 108b may be exposed by the respective openings O through parts of the second interconnection contacts LCH2. For example, the openings O may vertically overlap the first and second lower contacts 108a and 108b, with the first insulating layer 112 between each respective opening O and corresponding contact 108a or 108b.

In another example, although not illustrated in the drawing, some openings O may expose the first contact holes CH1 arranged in the first direction D1. Other openings O may expose the second contact holes CH2 arranged in the first direction D1. For example, some of the first and second contact holes CH1 and CH2 may be exposed by the process forming the openings O.

Figure 10A:
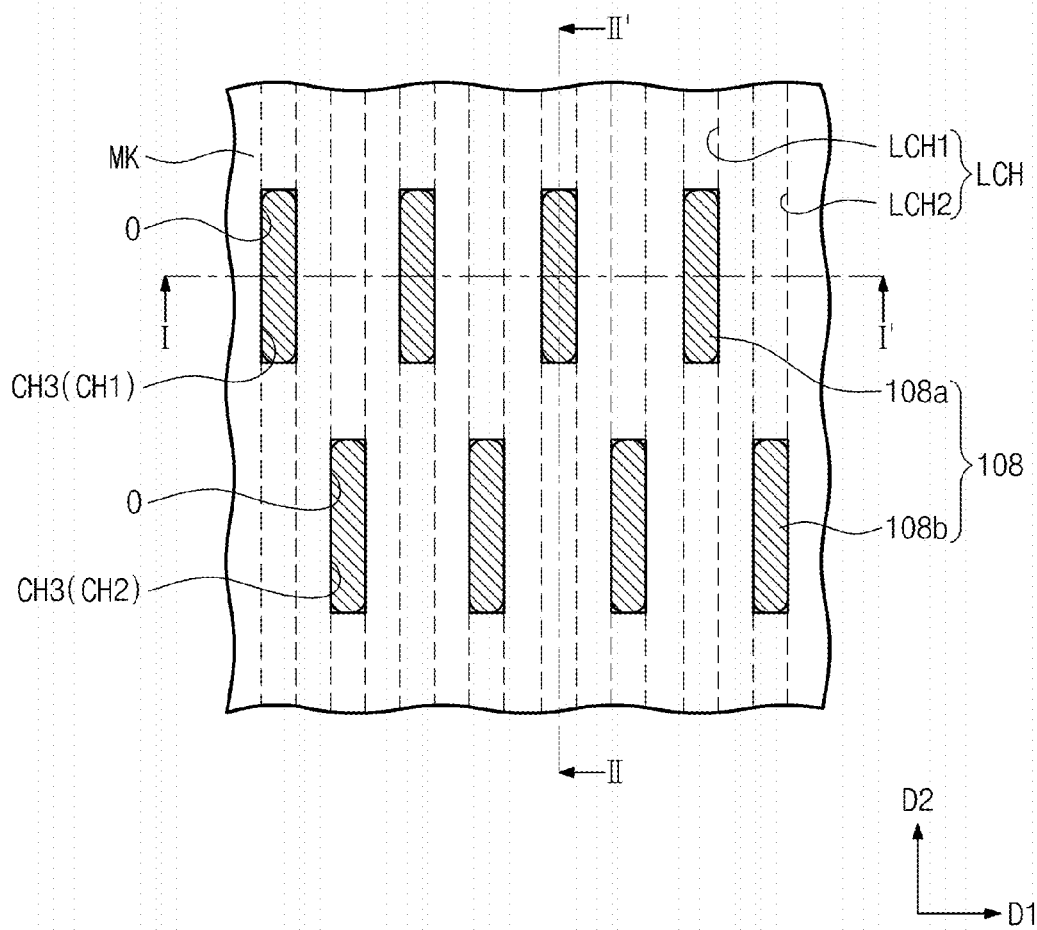
Figure 10B:
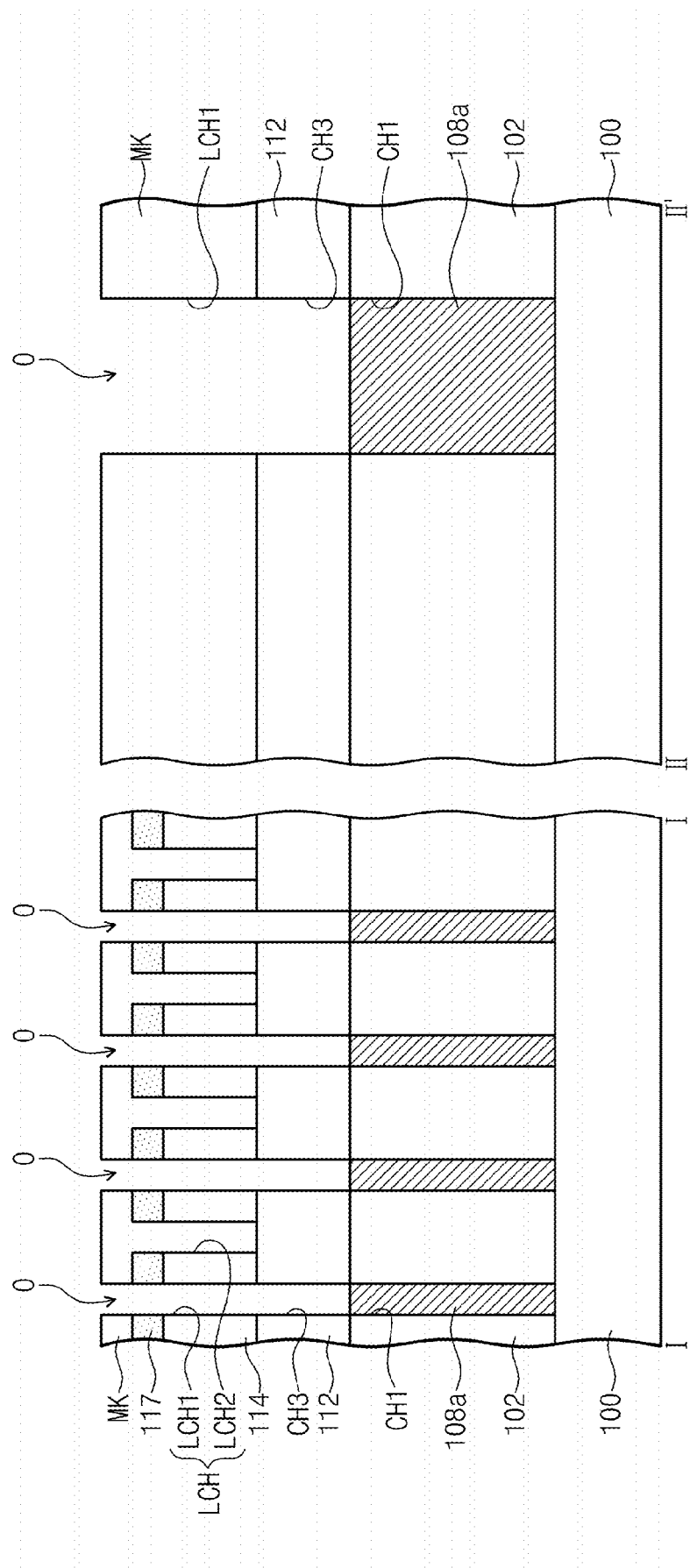

Referring to FIGS. 10A and 10B, the first insulating layer 112 exposed by the openings O may be etched to form third contact holes CH3. For example, the first insulating layer 112 exposed at the same time by the openings O and parts of the first and second interconnection contact holes LCH1 and LCH2 may be etched to form the third contact holes CH3.

In a top plan view, the first interconnection contact holes LCH1 may vertically overlap the third contact holes CH3 and the third contact holes CH3 may vertically overlap the first lower contacts 108a. The second interconnection contact holes LCH2 may vertically overlap the third contact holes CH3 and the third contact holes CH3 may vertically overlap the second lower contacts 108b. For example, the third contact holes CH3 may be self-aligned just below the first and second interconnection contact holes LCH1 and LCH2. For example, the third contact holes CH3 may be self-aligned with respect to the first and second interconnection contact holes LCH1 and LCH2. In certain embodiments where the first and second insulating layers 112 and 114 are merged into one insulating layer, the third contact holes CH3 are formed in a lower portion of the merged insulating layer. For example, the third contact holes CH3 form through holes in the merged insulating layer in combination with the interconnection contact holes LCH.

Top surfaces of the first and second lower contacts 108a and 108b may be exposed by the third contact holes CH3.

Figure 11A:
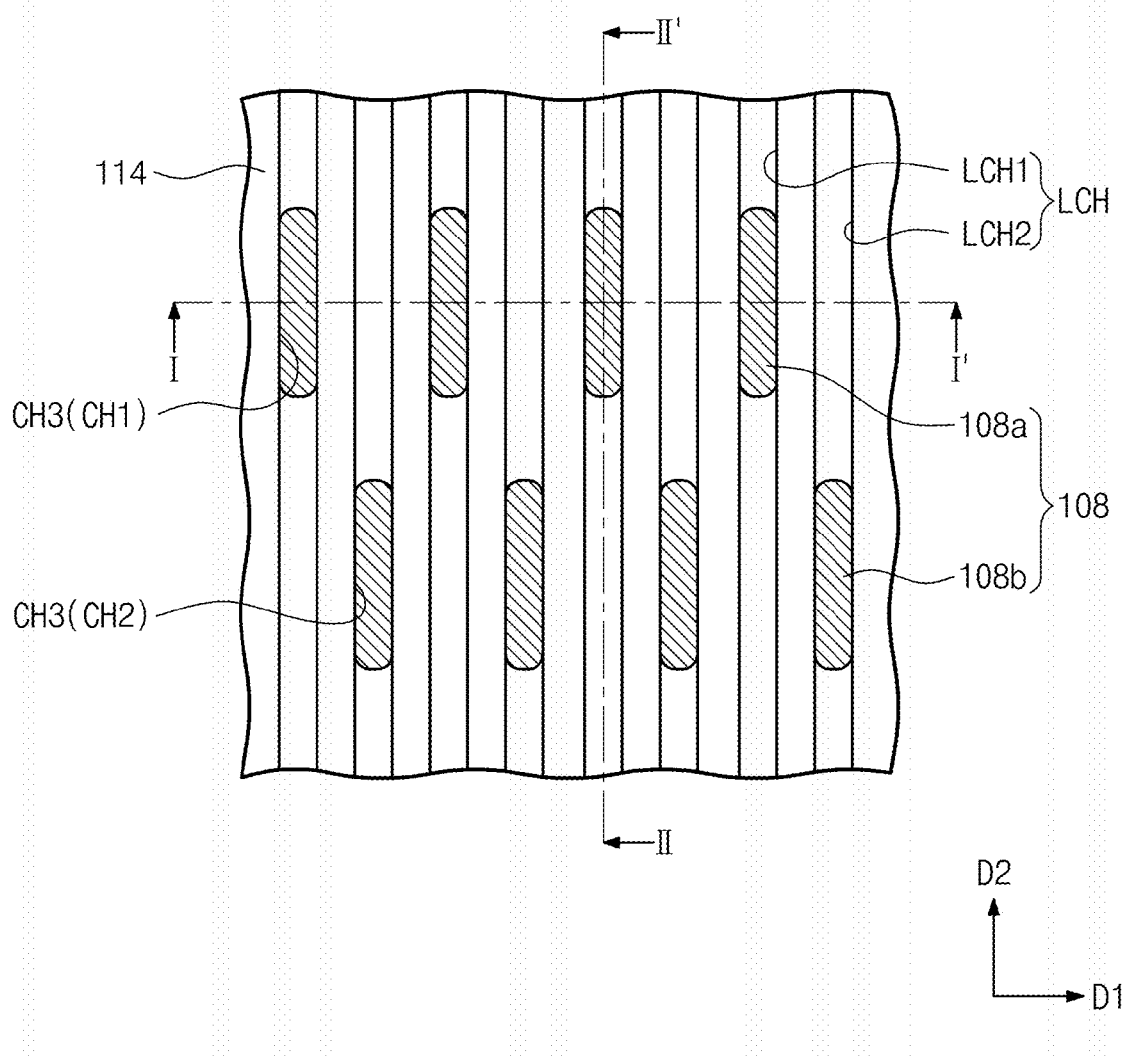
Figure 11B:
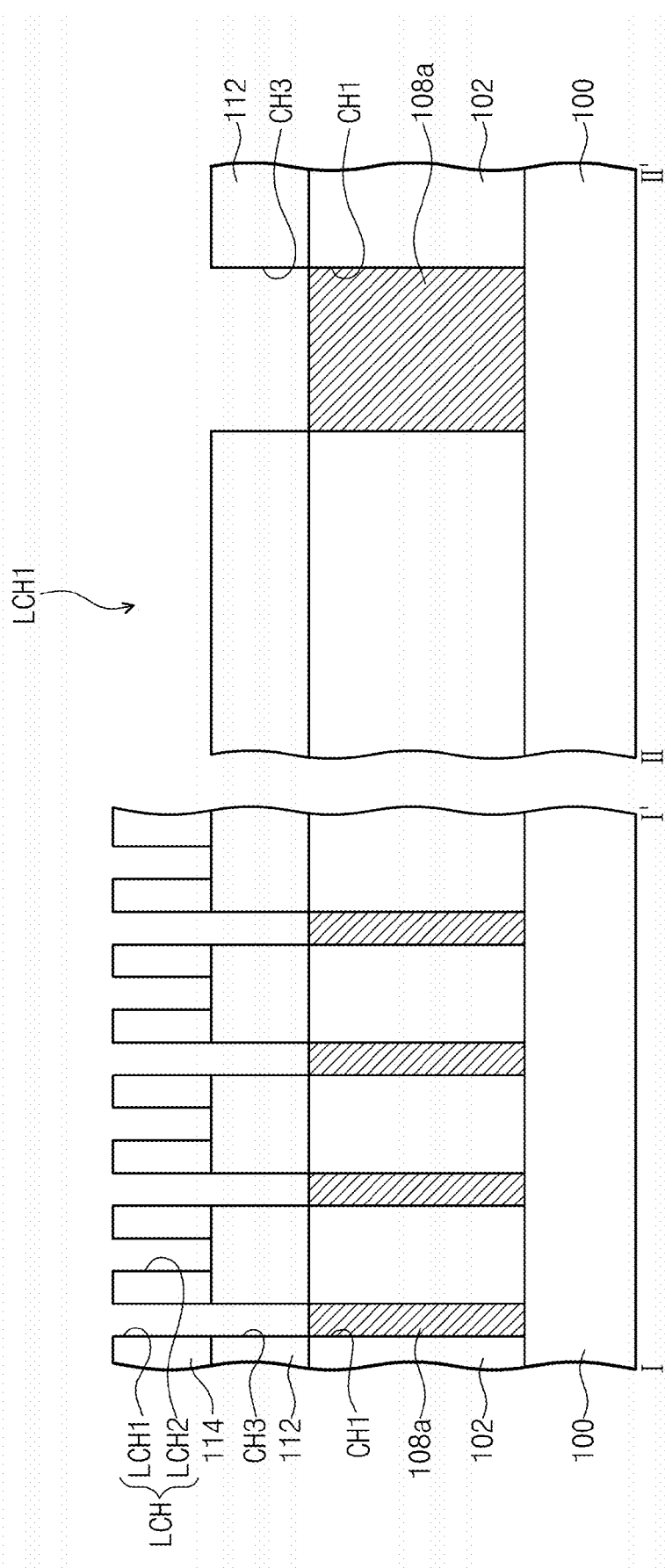

Referring to FIGS. 11a and 11b, after forming the third contact holes CH3, the mask layer MK may be selectively removed. Thus, a top surface of the first insulating layer 112 and a top surface of the hard mask pattern 117 that are covered by the mask layer MK may be exposed. The mask layer MK may be removed by an ashing process.

After removing the mask layer MK, the mask patterns 117 may be removed. Thus, a top surface of the second insulating layer 114 may be exposed. The mask patterns 117 may be removed by a wet or dry etching process.

Figure 12A:
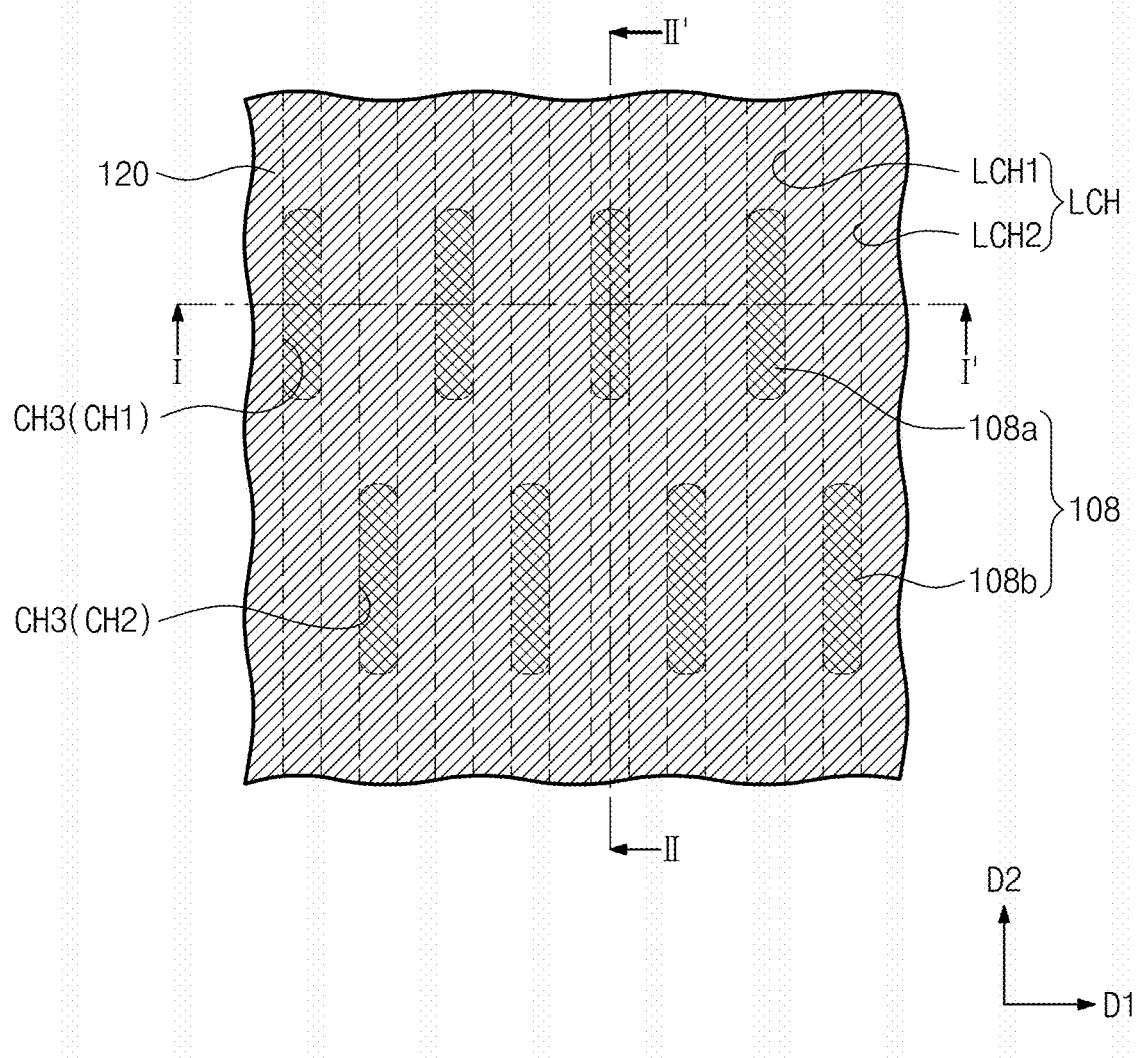
Figure 12B:
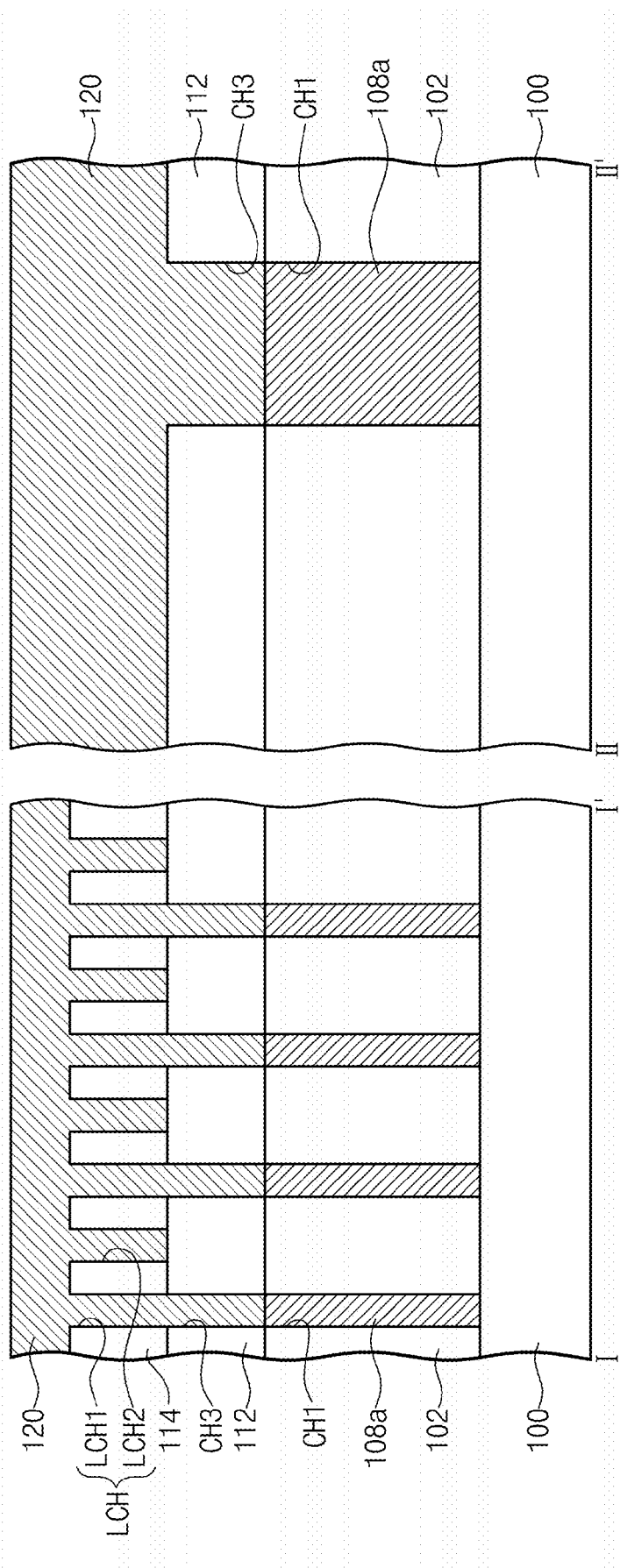

Referring to FIGS. 12A and 12B, a conductive layer 120 may be formed on the second insulating layer 114. The conductive layer 120 can cover a top surface of the second insulating layer 114 while filling the third contact holes CH3 and the first and second interconnection contact holes LCH1 and LCH2. The conductive layer 120 may be formed, for example, using any one of a chemical vapor deposition (CVD) method, a physical vapor deposition (PVD) method and an electroplating method. The conductive layer 120 may include, for example, a metal such as tungsten, copper, or aluminum.

Figure 13A:
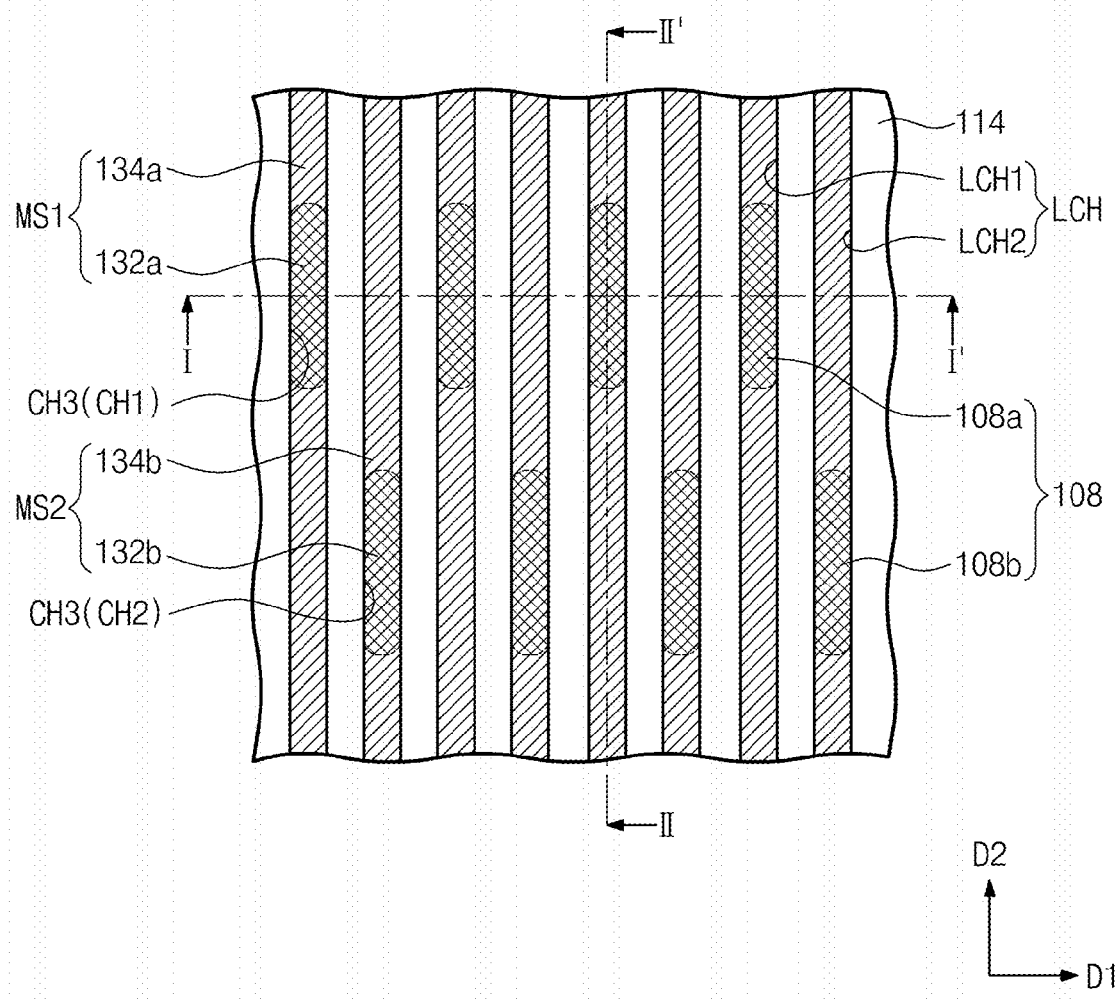
Figure 13B:
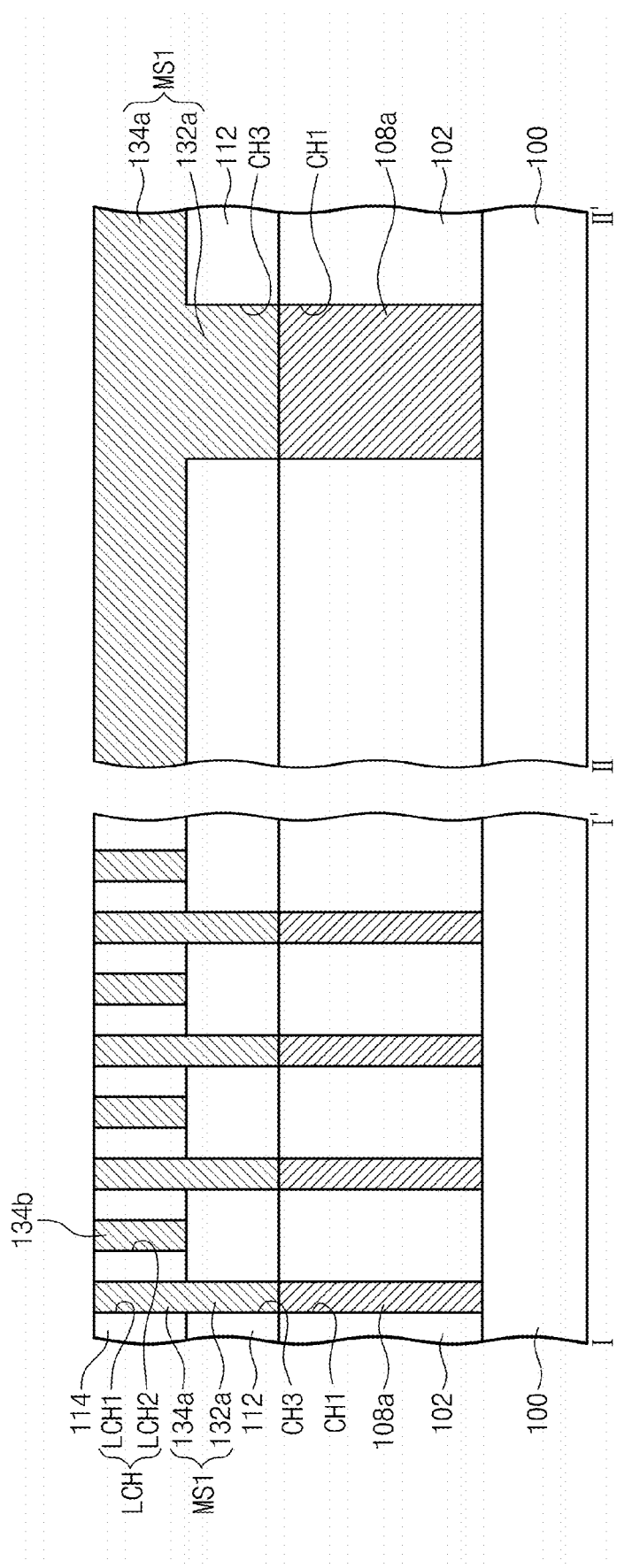

Referring to FIGS. 13A and 13B, a polishing process may be performed on the conductive layer 120 until a top surface of the second insulating layer 114 is exposed. Thus, interconnection structures MS may be formed. The interconnection structures MS may be insulated from one another. For example, the second insulating layer 114 may separate the interconnection structures MS.

The interconnection structures MS may include first interconnection structures MS1 and second interconnection structures MS2. The first interconnection structures MS1 and the second interconnection structures MS2 may alternately arranged along the first direction D1. The first interconnection structures MS1 may be electrically connected to the first lower contacts 108a, respectively. The second interconnection structures MS2 may be electrically connected to the second lower contacts 108b, respectively.

The first interconnection structures MS1 may include first upper contacts 132a and first conductive lines 134a. The first upper contacts 132a may be formed in the third contact holes CH3 exposing the first lower contacts 108a. The first conductive lines 134a may be formed in the first interconnection contact holes LCH1. The first upper contacts 132a and the first conductive lines 134a may be formed together when the conductive layer 120 is polished. For example, the first upper contacts 132a may be self-aligned on the first lower contacts 108a when the first conductive lines 134a are formed.

The second interconnection structures MS2 may include second upper contacts 132b and second conductive lines 134b. The second upper contacts 132b may be formed in the third contact holes CH3 exposing the second lower contacts 108b. The second conductive lines 134b may be formed in the second interconnection contact holes LCH2. The second upper contacts 132b and the second conductive lines 134b may be formed together when the conductive layer 120 is polished. For example, the second upper contacts 132b may be self-aligned on the second lower contacts 108b when the second conductive lines 134b are formed.

According to an embodiment of the inventive concept, an upper contact hole formed to provide an upper contact connecting a lower contact and a conductive line may be formed after forming an interconnection contact hole formed to provide a conductive line. For example, the first and second interconnection contact holes LCH1 and LCH2 are formed first, and an etching mask used to form the first and second interconnection contact holes LCH1 and LCH2 may be used again when forming the third contact holes CH3 so that the third contact holes CH3 vertically overlap the first and second interconnection contact holes LCH1 and LCH2. For example, the first and second upper contacts 132a and 132b formed in the third contact holes CH3 may be self-aligned to be disposed below the first and second interconnection contact holes LCH1 and LCH2. Thus, electrical shorts may be reduced that may be caused by misalignments of the patterns between two or more of the lower contacts, the upper contacts and the conductive lines. Therefore, reliability of a semiconductor device may be improved.

The above-disclosed subject matter is to be considered illustrative, and not restrictive, and the appended claims are intended to cover all such modifications, enhancements, and other embodiments, which fall within the true spirit and scope of the inventive concept. Thus, the scope of the inventive concept is to be determined by the broadest permissible interpretation of the following claims and their equivalents, and shall not be restricted or limited by the foregoing detailed description.

What is claimed is:

1. A method of manufacturing a semiconductor device, the method comprising:
   forming first and second insulating layers on a substrate;
   forming a first mask pattern on the second insulating layer;
   forming an interconnection contact hole in the second insulating layer using the first mask pattern as an etch mask, the interconnection contact hole exposing the first insulating layer;
   forming a second mask pattern having an opening exposing the interconnection contact hole, the second mask pattern different from the first mask pattern;
   etching the first insulating layer exposed by the opening of the second mask pattern to form a contact hole in the first insulating layer, wherein the contact hole is formed to have sidewalls aligned with sidewalls of the interconnection contact hole;
   removing the first mask pattern and the second mask pattern after the etching the first insulating layer exposed by the opening of the second mask pattern; and
   forming an interconnection structure in the contact hole and the interconnection contact hole.

2. The method of claim 1, wherein the first mask pattern is a hard mask pattern,
   wherein the forming the hard mask pattern comprises:
   forming a hard mask layer on the second insulating layer;
   forming spacers on the hard mask layer; and
   etching the hard mask layer exposed by the spacers.

3. The method of claim 2, wherein the forming the spacers comprises:
   forming a sacrificial pattern on the hard mask layer;
   forming a spacer layer conformally covering a top surface of the hard mask layer and a surface of the sacrificial pattern on the hard mask layer;
   removing the spacer layer formed on the top surface of the hard mask layer and a top surface of the sacrificial pattern; and
   selectively removing the sacrificial pattern.

4. The method of claim 2, wherein the hard mask pattern is used as an etching mask to form the interconnection contact hole and the contact hole.

5. The method of claim 2, wherein the hard mask pattern is removed after the second mask pattern is removed to expose a top surface of the second insulating layer.

6. The method of claim 1, wherein the contact hole is formed to vertically overlap the interconnection contact hole.

7. The method of claim 1, wherein the forming the interconnection structure comprises:
   forming a conductive layer filling the contact hole and the interconnection contact hole on the second insulating layer; and
   performing a polishing process on the conductive layer until a top surface of the second insulating layer is exposed.

8. The method of claim 1,
   wherein an interlayer insulating layer including a lower contact is provided to the substrate on which the first and second insulating layers are formed,
   wherein the interconnection contact hole is positioned over the lower contact to vertically overlap the lower contact,
   wherein the opening in the second mask pattern vertically overlaps the lower contact,
   wherein the contact hole formed by etching the first insulating layer exposes the lower contact, and
   wherein the interconnection structure contacts the lower contact.

9. The method of claim 8,
   wherein the forming the interconnection contact hole in the second insulating layer comprises forming a plurality of holes in the second insulating layer,
   wherein the second mask pattern has openings exposing at least a set of the plurality holes,
   wherein the contact hole of the first insulating layer forms a through hole in combination with a hole formed in the second insulating layer,
   wherein the interconnection structure is formed in the through hole and is formed of a conductive structure.

10. The method of claim 1, wherein the second mask pattern is formed on the first mask pattern.

11. The method of claim 10, wherein the first mask pattern includes a plurality of openings in a cross-sectional view, and the second mask pattern exposes a first set of the plurality of openings of the first mask pattern and covers a second set of the plurality of openings of the first mask pattern.

* * * * *